(12) United States Patent
Kim et al.

(10) Patent No.: US 9,905,551 B2
(45) Date of Patent: Feb. 27, 2018

(54) METHOD OF MANUFACTURING WAFER LEVEL PACKAGING INCLUDING THROUGH ENCAPSULATION VIAS

(71) Applicant: STS Semiconductor & Telecommunications Co., Ltd., Chungcheongnam-do (KR)

(72) Inventors: Eun Dong Kim, Seoul (KR); Jong Won Lee, Seoul (KR); Jai Kyoung Choi, Busan (KR)

(73) Assignee: STS SEMICONDUCTOR & TELECOMMUNICATIONS CO., LTD. (KR)

( * ) Notice: Subject to any disclaimer, the term of this patent is extended or adjusted under 35 U.S.C. 154(b) by 300 days.

(21) Appl. No.: 14/799,875

(22) Filed: Jul. 15, 2015

(65) Prior Publication Data
US 2016/0365324 A1    Dec. 15, 2016

(30) Foreign Application Priority Data

Jun. 9, 2015 (KR) .................. 10-2015-0081408
Jun. 9, 2015 (KR) .................. 10-2015-0081409
Jun. 10, 2015 (KR) .................. 10-2015-0081778

(51) Int. Cl.
*H01L 25/00* (2006.01)
*H01L 21/48* (2006.01)
(Continued)

(52) U.S. Cl.
CPC ............ *H01L 25/50* (2013.01); *H01L 21/486* (2013.01); *H01L 21/4853* (2013.01); *H01L 21/6835* (2013.01); *H01L 23/5383* (2013.01); *H01L 23/5384* (2013.01); *H01L 23/5389* (2013.01); *H01L 24/19* (2013.01); *H01L 24/20* (2013.01); *H01L 24/97* (2013.01); *H01L 21/568* (2013.01); *H01L 23/3128* (2013.01); *H01L 23/49816* (2013.01); *H01L 23/50* (2013.01); *H01L 24/16* (2013.01); *H01L 24/17* (2013.01); *H01L 24/32* (2013.01); *H01L 24/48* (2013.01);
(Continued)

(58) Field of Classification Search
CPC ......... H01L 25/50; H01L 24/19; H01L 24/20; H01L 21/6835; H01L 24/97; H01L 21/486; H01L 21/4853
See application file for complete search history.

(56) References Cited

U.S. PATENT DOCUMENTS 8,754,514 B2    6/2014 Yu et al.
9,142,510 B2    9/2015 Lee et al.
(Continued)

FOREIGN PATENT DOCUMENTS

KR    20090089578 A    8/2009
KR    20100098087 A    9/2010
(Continued)

*Primary Examiner* — John P Dulka
(74) *Attorney, Agent, or Firm* — Renaissance IP Law Group LLP

(57) ABSTRACT

Provided is a method of manufacturing a wafer level package. The method includes forming a repassivation layer that encapsulates a plurality of semiconductor chips isolated from a wafer, forming a through encapsulation via (TEV) in the repassivation layer, forming a redistribution layer electrically connected to the TEV, and forming a bump ball on the redistribution layer.

19 Claims, 28 Drawing Sheets

170: 170a, 170b

(51) Int. Cl.
  *H01L 21/683* (2006.01)
  *H01L 23/538* (2006.01)
  *H01L 23/31* (2006.01)
  *H01L 21/56* (2006.01)
  *H01L 23/00* (2006.01)
  *H01L 25/065* (2006.01)
  *H01L 25/10* (2006.01)
  *H01L 25/16* (2006.01)
  *H01L 23/498* (2006.01)
  *H01L 23/50* (2006.01)

(52) U.S. Cl.
  CPC ............ *H01L 24/73* (2013.01); *H01L 24/92* (2013.01); *H01L 25/0657* (2013.01); *H01L 25/105* (2013.01); *H01L 25/16* (2013.01); *H01L 2221/68345* (2013.01); *H01L 2221/68381* (2013.01); *H01L 2224/04105* (2013.01); *H01L 2224/05025* (2013.01); *H01L 2224/0557* (2013.01); *H01L 2224/06181* (2013.01); *H01L 2224/12105* (2013.01); *H01L 2224/13025* (2013.01); *H01L 2224/16145* (2013.01); *H01L 2224/16146* (2013.01); *H01L 2224/16235* (2013.01); *H01L 2224/17181* (2013.01); *H01L 2224/2518* (2013.01); *H01L 2224/32145* (2013.01); *H01L 2224/48091* (2013.01); *H01L 2224/48227* (2013.01); *H01L 2224/48235* (2013.01); *H01L 2224/73204* (2013.01); *H01L 2224/73259* (2013.01); *H01L 2224/73265* (2013.01); *H01L 2224/73267* (2013.01); *H01L 2224/83191* (2013.01); *H01L 2224/83192* (2013.01); *H01L 2224/83815* (2013.01); *H01L 2224/92143* (2013.01); *H01L 2224/97* (2013.01); *H01L 2225/06513* (2013.01); *H01L 2225/06517* (2013.01); *H01L 2225/06541* (2013.01); *H01L 2225/1035* (2013.01); *H01L 2225/1058* (2013.01); *H01L 2924/00014* (2013.01); *H01L 2924/15311* (2013.01); *H01L 2924/18162* (2013.01); *H01L 2924/19041* (2013.01); *H01L 2924/19042* (2013.01); *H01L 2924/19104* (2013.01); *H01L 2924/19105* (2013.01)

(56) References Cited

U.S. PATENT DOCUMENTS

| | | | |
|---|---|---|---|
| 2010/0237481 | A1 | 9/2010 | Chi et al. |
| 2013/0037950 | A1* | 2/2013 | Yu ............... H01L 23/49816 257/738 |
| 2015/0364425 | A1 | 12/2015 | Lee et al. |
| 2016/0148887 | A1* | 5/2016 | Yu ............... H01L 23/5389 257/773 |
| 2017/0110421 | A1* | 4/2017 | Liu ............... H01L 24/02 |
| 2017/0271203 | A1* | 9/2017 | Liu ............... H01L 21/76825 |

FOREIGN PATENT DOCUMENTS

| | | |
|---|---|---|
| KR | 20100105506 A | 9/2010 |
| KR | 20130018090 A | 2/2013 |
| KR | 20140000980 A | 1/2014 |
| KR | 20140084300 A | 7/2014 |

* cited by examiner

170 : 170a, 170b
180' : 180a', 180b'

180: 180a, 180b

130: 130a, 130b
140: 140a, 140b
150: 150a, 150b
170: 170a, 170b

130: 130a,130b
140: 140a,140b
150: 150a,150b
170: 170a,170b
180: 180a,180b

180': 180a', 180b'

180': 180a', 180b'

180: 180a, 180b

110: 111,113,115,117
130: 130a,130b
140: 140a,140b
150: 150a,150b
170: 170a,170b
180: 180a,180b

150: 150a, 150b

METHOD OF MANUFACTURING WAFER LEVEL PACKAGING INCLUDING THROUGH ENCAPSULATION VIAS

CROSS-REFERENCE TO RELATED APPLICATIONS

This application claims priority under 35 U.S.C. § 119 to Korean Patent Application No. 10-2015-0081409, filed on Jun. 9, 2015, Korean Patent Application No. 10-2015-0081408, filed on Jun. 9, 2015 and Korean Patent Application No. 10-2015-0081778, filed on Jun. 10, 2015, the disclosures of which are incorporated herein by reference in its entirety.

TECHNICAL FIELD

The present invention relates to a method of manufacturing a wafer level package, and more particularly, to a method of manufacturing a fan-out type wafer level package.

BACKGROUND

In the related art, a package is manufactured by a method that cuts a wafer including a plurality of chips along a dicing line to isolate the wafer into the plurality of chips and performs a packaging process on each of the isolated plurality of chips.

The related art packaging process includes a number of processes such as a die attaching process, a wire bonding process, a molding process, and/or the like, and thus, considering the number of chips obtained from one wafer, a time taken in packaging all the chips is too long. Therefore, a method has been recently proposed where a packaging process is preferentially performed in a wafer level state, and then, a wafer level package is diced into a plurality of packages. A package manufactured by such a method is referred to as a wafer level package (WLP).

In the related art WLP process, a plurality of wafer chips is isolated from a wafer state and rearranged on a mold frame, and then, the rearranged wafer chips are encapsulated by a molding material and reconstituted in a wafer form.

Subsequently, the mold frame is isolated from the molding material with built-in the wafer chips, and a redistribution layer process and/or the like is performed for a bottom of the molding material from which the mold frame is isolated.

In the related art wafer level package process, since a wafer form is reconstituted with a molding material, a warpage defect occurs due to a characteristic of the molding material in performing the process.

The warpage defect degrades a reliability of a photomask process that is performed for forming a redistribution layer.

Moreover, a molding process that is performed for reconstituting a plurality of rearranged wafer chips into a wafer form with a molding material consumes much time in a total process time, and for this reason, a yield rate is lowered, and the manufacturing cost increases.

SUMMARY

Accordingly, the present invention provides a method of manufacturing a wafer level package, which enhances productivity and quality and reduces the process cost.

In one general aspect, a method of manufacturing a wafer level package includes: (A) forming a first repassivation layer that encapsulates a plurality of semiconductor chips isolated from a wafer; (B) forming a through encapsulation via (TEV) in the first repassivation layer; (C) forming a redistribution layer, electrically connected to the TEV, on the first repassivation layer; and (D) forming a conductive bump on the redistribution layer.

In another general aspect, a method of manufacturing a wafer level package includes: (A) forming a repassivation layer that encapsulates a plurality of semiconductor chips isolated from a wafer; (B) forming a through encapsulation via (TEV) in the repassivation layer; (C) forming, on a first surface of the repassivation layer, a bottom redistribution layer electrically connected to one end of the TEV exposed to on the first surface; (D) forming a bottom bump on the bottom redistribution layer to finish a wafer level package including a bottom layer structure; (E) forming, on a second surface on the reverse of the first surface of the repassivation layer, a top redistribution layer electrically connected to the other end of the TEV exposed to on the second surface; and (F) forming a top bump on the top redistribution layer to finish a wafer level package including a top layer structure.

In another general aspect, a method of manufacturing a wafer level package includes: (A) forming a first repassivation layer that encapsulates a plurality of semiconductor chips isolated from a wafer; (B) forming a through encapsulation via (TEV) in the first repassivation layer; (C) forming a redistribution layer, electrically connected to the TEV, on the first repassivation layer; (D) forming an under bump metal layer on the redistribution layer; (E) forming a chip-stacked type package on the semiconductor chip by using a thermal compression non-conductive paste bonding process; and (F) forming a bump ball on the under bump metal layer by using a ball drop process.

Other features and aspects will be apparent from the following detailed description, the drawings, and the claims.

DETAILED DESCRIPTION OF EMBODIMENTS

Figure 1:
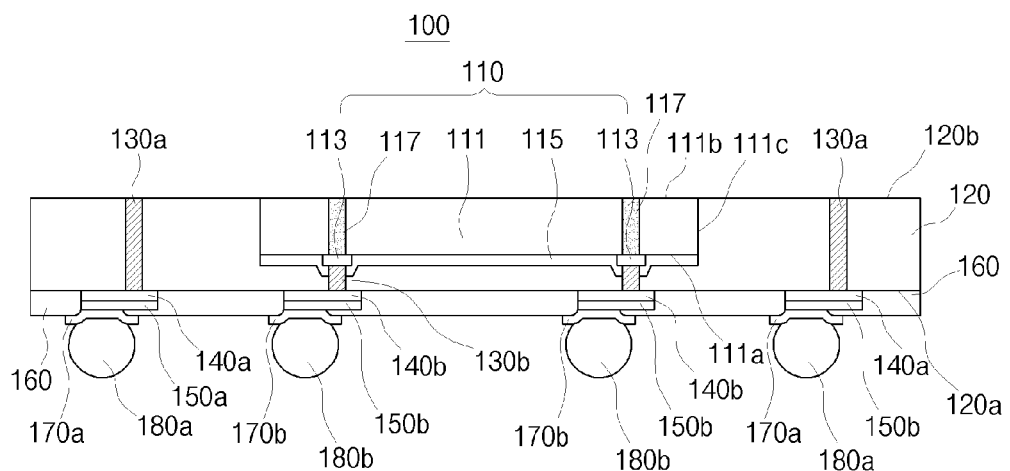
FIG. 1 is a cross-sectional view of each of a plurality of semiconductor packages isolated from a fan-out type wafer level package manufactured according to an embodiment of the present invention.

Hereinafter, the present invention will be described in detail such that those of ordinary skill in the art can easily understand and reproduce the present invention through embodiments which will be described below with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In this disclosure below, when an element is described as being connected to another element, the element may be directly connected to the other element, or a third element may be interposed therebetween. Also, in the drawings, a shape or a size of each element is exaggerated for convenience of a description and clarity, and elements irrelevant to a description are omitted.

In the drawings, like reference numerals refer to like elements.

The terms described herein are used for the purpose of describing the present invention, and are not used for limiting a meaning or the scope of the present invention described in claims.

The terms "one end", "other end", "top" and "bottom" are used for distinguishing relative positions of elements. For example, when an upper position in the drawings is referred to as an upper portion and a lower position in the drawings is referred to as a lower portion for convenience of a description, the upper portion may be referred to as a lower portion, and the lower portion may be referred to as an upper portion. Likewise, one end may be referred to as the other end, and the other end may be referred to as one end.

Since the terms "passivation" and "repassivation" described herein should be clearly distinguished, the terms will be briefly described.

First, a pre-processing process and a post-processing process are defined for clearly distinguishing passivation from repassivation.

The pre-processing process is defined as a series of all processes that are performed in order for a wafer manufacturer to produce a wafer, and the post-processing process is defined as a series of all processes where a plurality of wafer chips are isolated from a wafer with which a package manufacturer is provided from the wafer manufacturer, the isolated plurality of wafer chips are rearranged, and a bumping process is performed for the rearranged plurality of wafer chips at a time (or at the same time).

In defining the pre-processing process and the post-processing process, the passivation is defined as all kinds of coating layers which are formed in the pre-processing process, and the repassivation is defined as all kinds of coating layers which are formed in the post-processing process.

Particularly, in this disclosure below, it should be noted that the repassivation is used for the purpose of encapsulating a wafer chip, in addition to a function of the passivation that protects, from a harmful environment, surfaces of layers or elements formed in the wafer chip. That is, in embodiments of the present invention, the repassivation replaces a molding material which is used for forming a wafer level package of the related art.

If differently construed, the repassivation may be construed as an element configuring a body of each of a plurality of semiconductor package isolated from a wafer level package.

FIG. 1 is a cross-sectional view of each of a plurality of semiconductor packages isolated from a fan-out type wafer level package manufactured according to an embodiment of the present invention.

Referring to FIG. 1, a semiconductor package 100 according to an embodiment of the present invention may include a wafer chip 110 that is isolated from a fan-out type wafer level package piece by piece, a first repassviation layer 120 that encapsulates the wafer chip 110, a through encapsulation via (TEV) 130 that passes through the inside of the first repassivation layer 120, a redistribution seed layer 140 that is formed on a first surface 120a of the repassivation layer 120, a redistribution layer (RDL) 150 that is formed on the redistribution seed layer 140, a second repassivation layer 160 that is formed on the first repassviation layer 120, an under bump metallization (UBM) layer 170 that is formed on the RDL 150 (150a and 150b) exposed by an opening area of the second repassivation layer 160, and a conductive bump 180 that is formed on the UBM layer 170.

The wafer chip 110 is a chip which is formed of silicon and is isolated from the wafer piece by piece, and may include a semiconductor chip 111, an input/output pad 113, and a passivation layer 115. The semiconductor chip 111 may include a first surface 111a, a second surface 111b that is disposed on the reverse of the first surface 111a, a side surface 111c that connects the first surface 111a to the second surface 111b, and a through silicon via (TSV) 117 that vertically passes through a space between the first surface 111a and the second surface 111b. Here, one end of the TSV 117 may be formed to be exposed to on the first surface 111a, and the other end of the TSV 117 may be formed to be exposed to on the second surface 111b. The input/output pad 113 may be formed on the first surface 111a of the semiconductor chip 111 and may be electrically connected to the one end of the TSV 117 exposed to on the first surface 111a. The passivation layer 115 may be formed all over the first surface 111a of the semiconductor chip 111 and may include an opening area that exposes the input/output pad 113.

The first repassivation layer 120 may encapsulate the wafer chip 1110, and the TEV 130 may be formed therein. The first repassivation layer 120 may be formed of polyimide (PI), benzo cyclo butene (BCB), poly benz oxazole (PBO), bismaleimidetriazine (BT), phenolic resin, epoxy, silicon, silicon oxide ($SiO_2$), silicon nitride ($Si_3N_4$), or a combination thereof.

The TEV 130 may be formed of metal or a metal post. The TEV 130 may include a first TEV 130a and a second TEV 130b. The first TEV 130a may be formed to be separated from the side surface 111c of the semiconductor chip 111 by a certain interval. The second TEV 130b may be formed under the wafer chip 110. One end of the first TEV 130a may be formed to be exposed to on the first surface 120a of the first repassivation layer 120, and the other end of the first TEV 130a may be formed to be exposed to on the second surface 120b of the first repassivation layer 120. One end of the second TEV 130b may be formed to be exposed to on the first surface 120a of the first repassivation layer 120, and the other end of the second TEV 130b may be formed to be electrically connected to the input/output pad 113 exposed by an opening area of the passivation layer 115. The TEV 130 may be formed of Ti/Cu, TiW/Ni, Ti/Ni, TiW/NiV, Cr/Cu, Cr/Ni, Cr/NiV, Ti/Cu/Ni, TiW/Cu/Ni, TiW/Cu/NiV, Cr/Cu/NiV, or a combination thereof.

The redistribution seed layer 140 is a seed layer for forming the RDL 150 (150a and 150b). The redistribution seed layer 140 may be formed on the first surface 120a of the first repassivation layer 120 and may be electrically connected to the one end of the TEV 130 exposed to on the first surface 120a. The redistribution seed layer 140 may include a first redistribution seed layer 140a and a second redistribution seed layer 140b. The first redistribution seed layer 140a may be electrically connected to the one end of the first TEV 130a exposed to on the first surface 120a. The second redistribution seed layer 140b may be electrically connected to the one end of the second TEV 130b exposed to on the first surface 120a.

The RDL 150 may be formed on the redistribution seed layer 140 and may be electrically connected to the redistribution seed layer 140. The RDL 150 may redistribute an electrical connection path between the input/output pad 113 of the semiconductor chip 111 and the bump 180 irrespective of a position of the input/output pad 113 of the semiconductor chip 111. The RDL 150 may include a first RDL 150a and a second RDL 150b. The first RDL 150a may be formed on the first redistribution seed layer 140a and may be electrically connected to the first redistribution seed layer 140a. The second RDL 150b may be formed on the second redistribution seed layer 140b and may be electrically connected to the second redistribution seed layer 140b.

The second repassivation layer 160 may be formed all over the first surface 120a of the first repassivation layer 120 and may include an opening area that exposes a partial region of the RDL 150.

The UBM layer 170 is a layer that induces deposition of the bump 180. The UBM layer 170 may be formed in a partial region of the RDL 150 exposed by the second repassivation layer 160 and may be electrically connected to the RDL 150. The UBM layer 170 may include a first UBM layer 170a and a second UBM layer 170b. The first UBM layer 170a may be formed on the first RDL 150a, and the second UBM layer 170b may be formed on the second RDL 150b.

The conductive bump 180 may be formed on the UBM layer 170 and may be electrically connected to the UBM layer 170. The conductive bump 180 may include a first conductive bump 180a and a second conductive bump 180b. The first conductive bump 180a may be formed on the first UBM layer 170a and may be electrically connected to the first UBM layer 170a. The second conductive bump 180b may be formed on the second UBM layer 170b and may be electrically connected to the second UBM layer 170b. Therefore, the first conductive bump 180a may be electrically connected to the first TEV 130a by a redistribution path formed by the first redistribution seed layer 140a, the first RDL 150a, and the first UBM layer 170a, and the second TSV 117 formed in the semiconductor chip 111 may be electrically connected to the second conductive bump 180b by a redistribution path formed by the second TEV 130b, the second redistribution seed layer 140b, the second RDL 150b, and the second UBM layer 170b.

In the semiconductor package 100 according to an embodiment of the present invention, since a repassivation material forming the first repassivation layer 120 is used instead of a molding material of the related art, a molding process which is performed in a wafer level package process of the related art may be skipped. Accordingly, since the molding process is skipped, a total process time is much shortened.

Moreover, in the semiconductor package 100 according to an embodiment of the present invention, since a TEV that passes through the inside of the first repassivation layer 120 is formed, the present invention may be applied to various package structures where another package and an element including an active element or a passive element are stacked on the first repassivation layer 120.

FIGS. 2 to 16 are cross-sectional views illustrating a method of manufacturing a fan-out type wafer level package for manufacturing the semiconductor package of FIG. 1, according to an embodiment of the present invention.

In each of the cross-sectional views, only one wafer chip is illustrated. This is for helping understand the present invention. It should be noted that each of the following processes is simultaneously performed for a plurality of wafer chips isolated from a wafer in an actual process.

Figure 2:
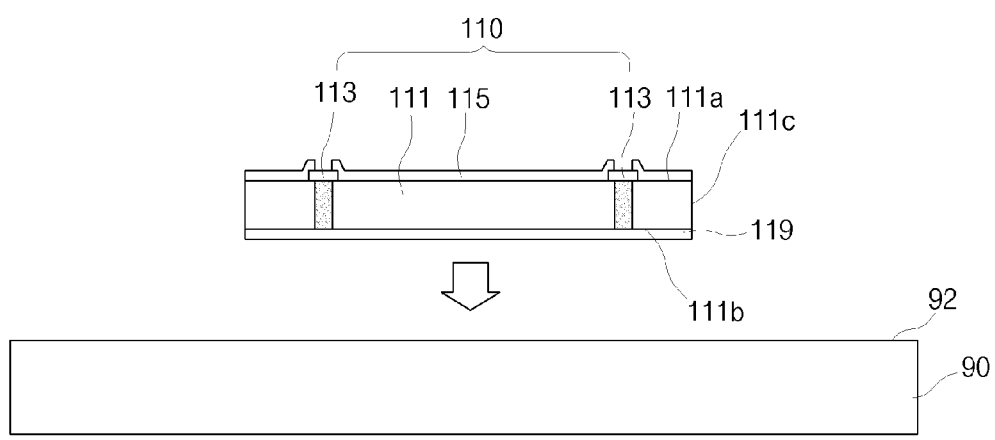
FIGS. 2 to 16 are cross-sectional views illustrating a method of manufacturing a fan-out type wafer level package for manufacturing the semiconductor package of FIG. 1, according to an embodiment of the present invention.

First, referring to FIG. 2, a process of attaching a plurality of semiconductor chips 111, isolated from a wafer level package, to a supporting frame 90 may be performed.

A die attach film (DAF) 119 may be coated on a second surface 111b of each of the plurality of semiconductor chips 111, and the semiconductor chips 111 may be attached to a surface 92 of the supporting frame 90 by the DAF 119. The DAF 119 may be a thermosetting release film. The thermosetting release film may maintain a viscosity where the thermosetting release film has no flowability before being hardened and a viscosity which enables the conductive bump 180 to pass through the thermosetting release film. The thermosetting release film may use a thermally sensitive tape of which an adhesion (or an adherence pressure) is lost after being hardened by heat. The thermally sensitive tape may use all kinds of tapes having characteristic where a tape has an adhesion (or an adherence pressure) at a normal temperature, but when the tape is heated at a specific heating temperature, the tape is simply striped because an adhesion is lost.

The supporting frame 90 prevents a warpage defect from occurring when the following process is being performed in a state where a wafer level package is reconstituted based on a molding material in a related art method of manufacturing a wafer level package. The supporting frame 90 may use a silicon wafer or a glass wafer.

The supporting frame 90 may use a molding frame which is formed of a metal material and is used in the molding process, but in a wafer level package process according to an embodiment of the present invention, since the molding process is skipped, an appropriate means for replacing the molding frame (a carrier formed of a metal material) formed of a metal material is needed. Therefore, in the present invention, a silicon wafer or a glass wafer may be used.

According to an embodiment of the present invention, all processes may be performed on a silicon wafer or a glass wafer, and thus, a warpage defect of a wafer level package reconstituted by the first repassivation layer 120 is prevented.

Figure 3:
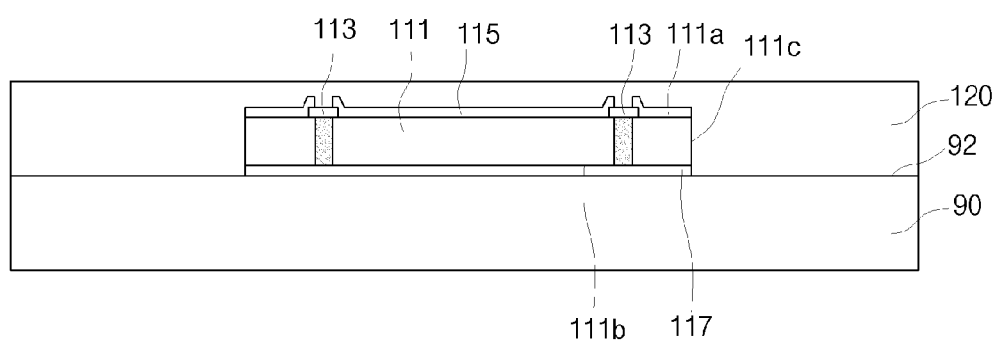

Subsequently, referring to FIG. 3, a process of forming the first repassivation layer 120 that encapsulates the surface 92 of the supporting frame 90, the input/output pad 113 formed on the first surface 111a of the semiconductor chip 111, the passivation layer 115, and the side surface 111c of the semiconductor chip 111 may be performed.

A method of forming the first repassivation layer 120 may use a coating process or a chemical vapor deposition (CVD) process. The first repassivation layer 120 may be formed to an appropriate thickness, which may be adjusted according to a process variable defined based on the coating process or the CVD process. The first repassivation layer 120 may be formed of polyimide (PI), benzo cyclo butene (BCB), poly benz oxazole (PBO), bismaleimidetriazine (BT), phenolic resin, epoxy, silicon, silicon oxide ($SiO_2$), silicon nitride ($Si_3N_4$), or a combination thereof.

Figure 4:
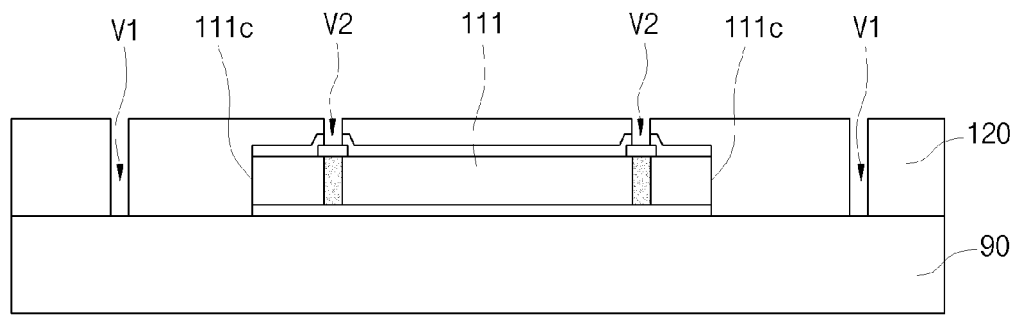

Subsequently, referring to FIG. 4, a process of forming a plurality of interposer via holes V1 and V2 passing through the inside of the first repassivation layer 120 may be performed. The interposer via holes V1 and V2 may be formed by using a laser drilling process or a photomask process including an exposure process and a development process. The interpose via holes V1 and V2 may include a first interposer via hole V1 and a second interposer via hole V2. The first interposer via hole V1 may be formed to be separated from the side surface 111c of the semiconductor chip 111 by a certain interval. The second interposer via hole V2 may be formed on the input/output pad 113 of the semiconductor chip 111. Therefore, the input/output pad 113 may be exposed to an upper portion by the second interposer via hole V2.

Figure 5:
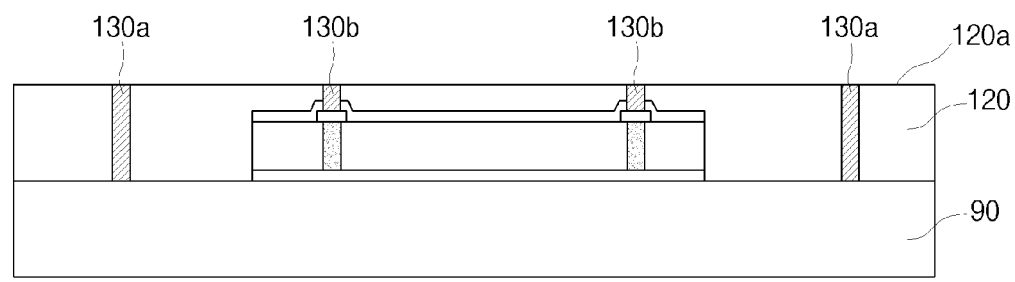

Subsequently, referring to FIG. 5, a process of forming the TEV 130 (130a and 130b) by filling a conductive material into the interposer via holes V1 and V2 may be performed. The conductive material may be metal or a metal post. A method of forming the metal or the metal post in the interposer via holes V1 and V2 may use an electroplating process or an electroless plating process. According to another embodiment, the conductive material may be a melting metal. The melting metal may be filled into the interposer via holes V1 and V2, and then, the TEV 130 (130a and 130b) may be formed by cooling the melting metal. One end of the conductive material filled into the interposer via holes V1 and V2 may be exposed to on the first surface 120a of the first repassivation layer 120.

Figure 6:
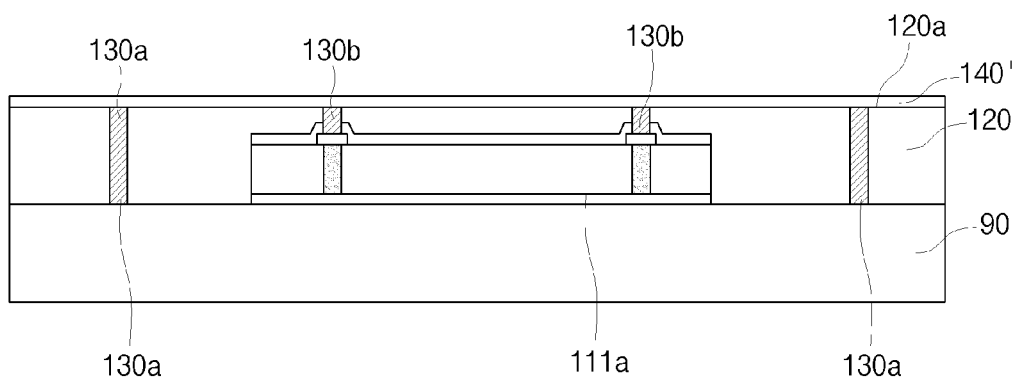

Subsequently, referring to FIG. 6, a metal seed layer 140' may be formed all over the first surface 120a of the first repassivation layer 120. Therefore, the metal seed layer 140' may be electrically connected to one end of the TEV 130 (130a and 130b) exposed to on the first repassivation layer 120. The metal seed layer 140' may be formed by a physical vapor deposition (PVD) process or the CVD process.

Figure 7:
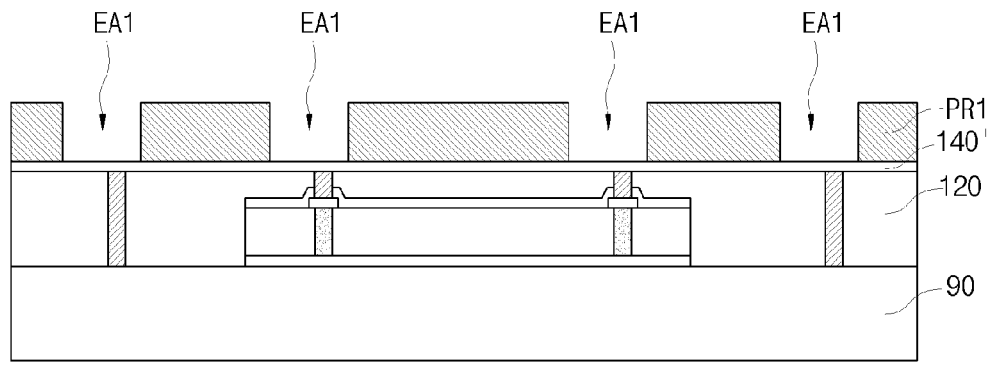

Subsequently, referring to FIG. 7, a process of forming a first photoresist layer PR1 on the metal seed layer 140' may be performed. The first photoresist layer PR1 may be formed all over the metal seed layer 140', and an exposure area EA1 of the first photoresist layer PR1 may be removed by the exposure process and the development process.

Figure 8:
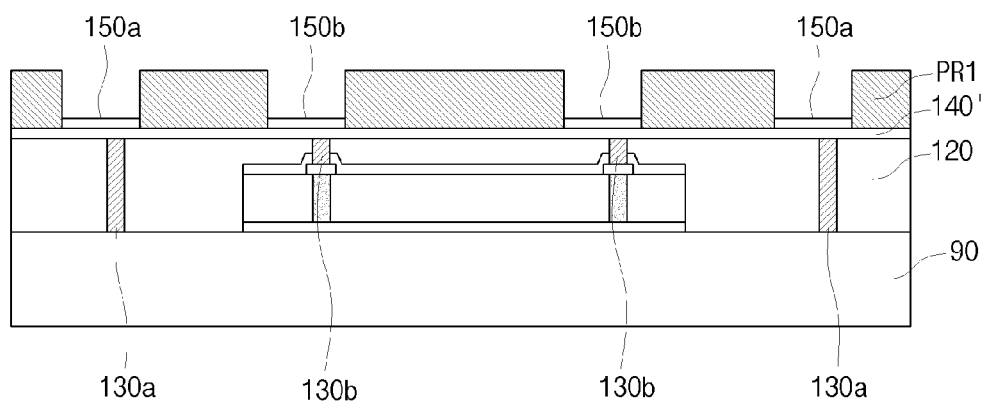

Subsequently, referring to FIG. 8, a process of forming the RDL 150 (150a and 150b) on the metal seed layer 140' which is exposed by removing the exposure area EA1 of the first photoresist layer PR1 may be performed. A method of forming the RDL 150 (150a and 150b) may use the electroplating process or the electroless plating process. In the present embodiment, the electroplating process is assumed as being used.

Figure 9:
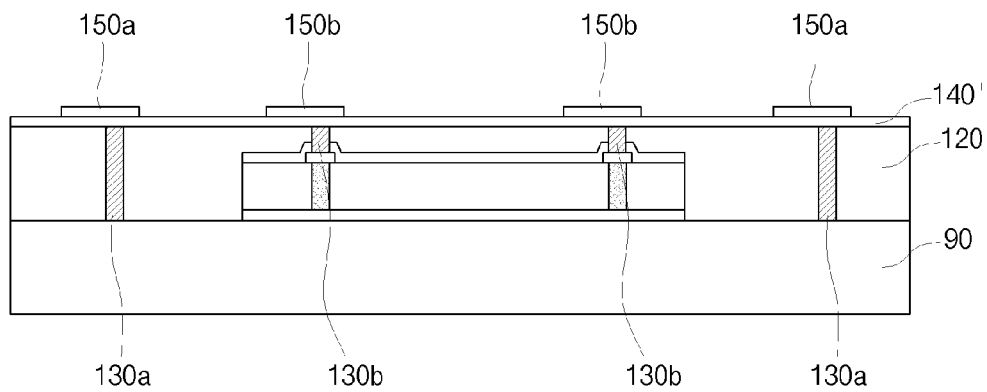

Subsequently, referring to FIG. 9, a process of removing the first photoresist layer PR1 formed on the metal seed layer 140' may be performed. A method of removing the first photoresist layer PR1 may use a dry etching process or a wet etching process.

Figure 10:
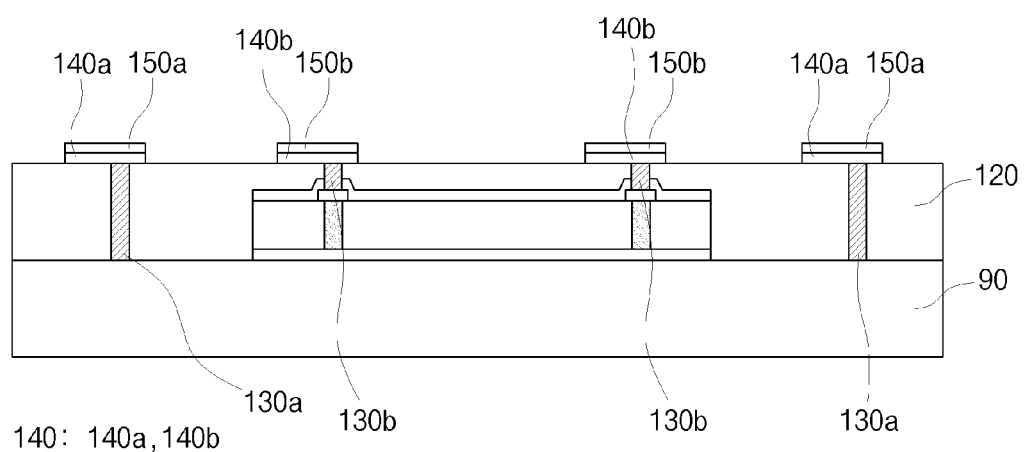

Subsequently, referring to FIG. 10, a process of removing the metal seed layer 140' which is exposed by removing the first photoresist layer PR1 may be performed. A method of removing the metal seed layer 140' may use the wet etching process or the dry etching process. Here, a separate etching mask may not be used for removing the metal seed layer 140' which is exposed by removing the first photoresist layer PR1. In this case, the RDL 150 formed on the metal seed layer 140' may act as an etching mask. While the exposed metal seed layer 140' is being etched, the RDL 150 may also be adjusted, but by appropriately adjusting an etching rate, only the metal seed layer 140' may be etched independent from the RDL 150.

Hereinafter, for clarity of a layer, the metal seed layer 140' which is left after the metal seed layer 140' which is exposed by removing the first photoresist layer PR1 is removed may be referred to as a redistribution seed layer, which is referred to by reference numeral 140.

Figure 11:
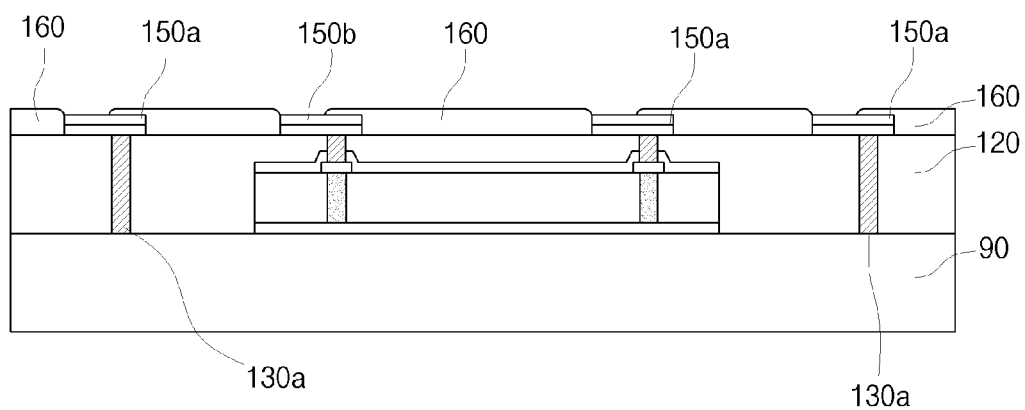

Subsequently, referring to FIG. 11, a process of forming the first repassivation layer 120 which is exposed by removing the metal seed layer 140' and the second repassivation layer 160 exposing a partial region of the RDL 150 (150a and 150b) may be performed. A method of forming the second repassivation layer 160 may use a photomask process including the exposure process and the development process.

Figure 12:
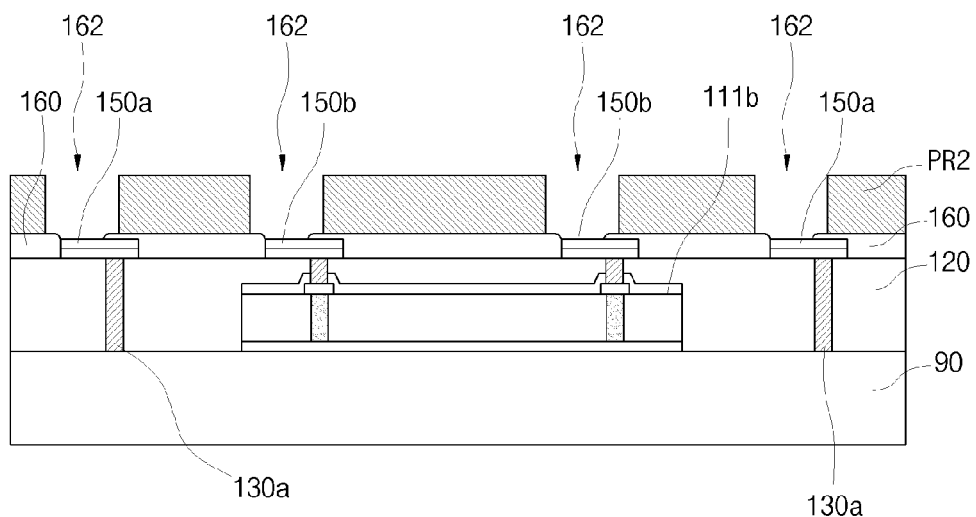

Subsequently, referring to FIG. 12, a process of forming a second photoresist layer PR2 on the second repassivation layer 160 may be performed. The second photoresist layer PR2 may be formed to have a uniform height and may include a contact hole 162 that exposes a partial region of the RDL 150 (150a and 150b) exposed by the second repassivation layer 160. Therefore, the partial region of the RDL 150 (150a and 150b) may be exposed to an upper portion by the contact hole 162. A method of forming the second photoresist layer PR2 including the contact hole 162 may use the photomask process including the exposure process and the development process.

Figure 13:
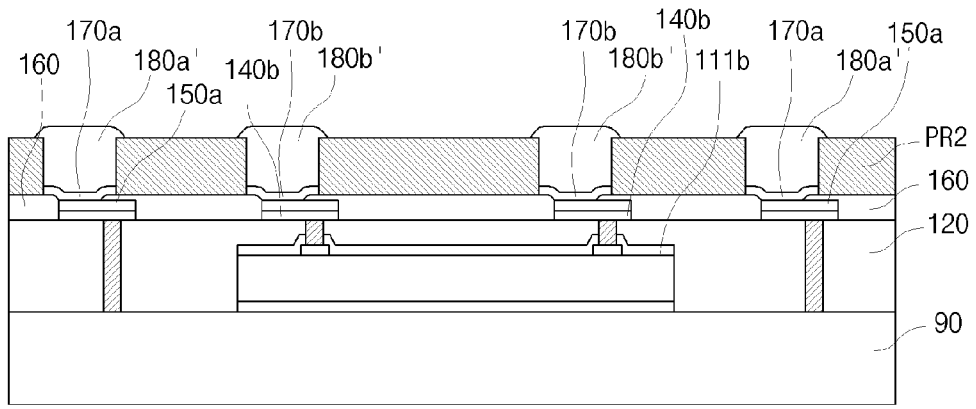

Subsequently, referring to FIG. 13, the UBM layer 170 (170a and 170b) and a bump material 180' (180a' and 180b') may be sequentially formed in the contact hole 162. A method of forming the UBM layer 170 (170a and 170b) and the bump material 180' (180a' and 180b') may use the electroplating process or the electroless plating process. Here, in a case of using the electroplating process, a UBM seed layer (not shown) may be further formed between the RDL 150 (150a and 150b) and the UBM layer 170 (170a and 170b). The bump material 180' (180a' and 180b') may be Al, Sn, Ni, Au, Ag, Pb, Bi, Cu, solder, or a combination thereof.

Figure 14:
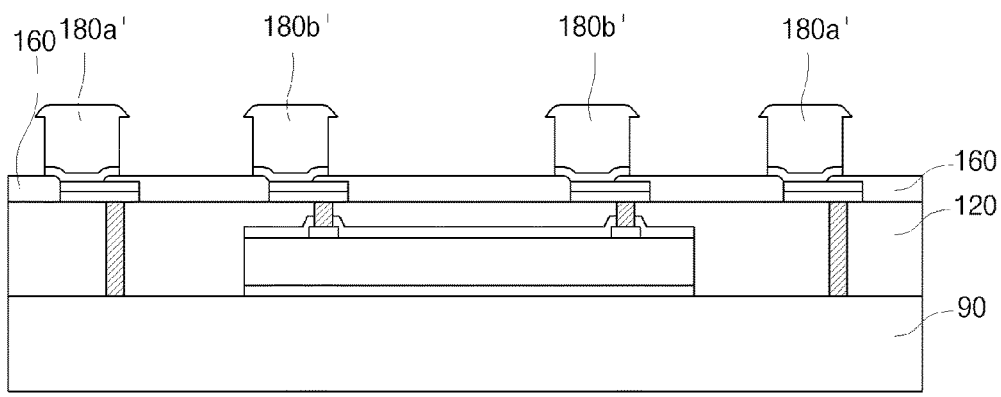

Subsequently, referring to FIG. 14, a process of forming the second photoresist layer PR2 including the contact hole 162 may be performed. A method of removing the second photoresist layer PR2 may use the dry etching process or the wet etching process. Since the second photoresist layer PR2 is removed, only the bump material 180' (180a' and 180b') having a cross-sectional profile of the contact hole 162 may remain.

Figure 15:
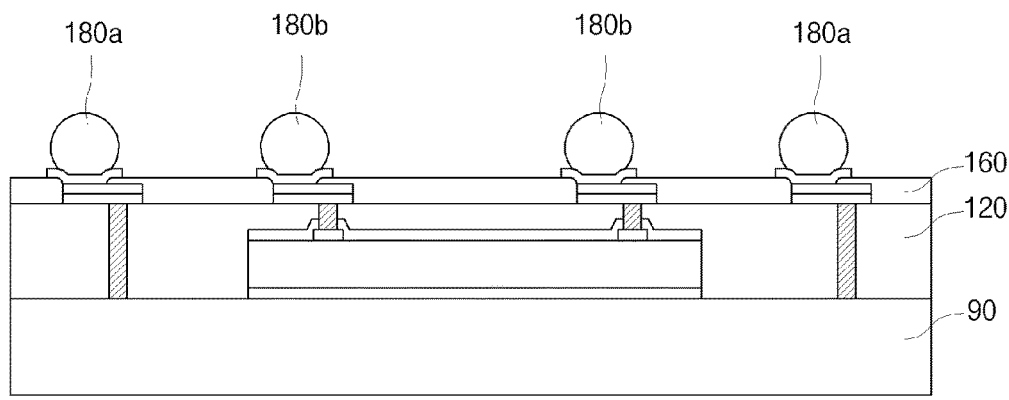

Subsequently, referring to FIG. 15, a process of forming the conductive bump 180 having a round shape from the bump material 180' may be performed by using a reflow process and a flux cleaning process.

Subsequently, referring to FIG. 16, a process of sequentially removing the supporting frame 90 and the DAF 119 from a finished wafer level package may be performed. A method of removing the supporting frame 90 may use a back grinding 192 process of grinding a bottom of the supporting frame 90. A method of removing the DAF 119 which is exposed by removing the supporting frame 90 may use a heating process of heating the DAF 119 at a specific heating temperature.

As a result, a series of all processes of manufacturing a wafer level package which is performed on the supporting frame 90 may be completed.

A finished wafer level package may be singularized into a plurality of semiconductor packages along a dicing line 194, and thus, the semiconductor package 100 illustrated in FIG. 1 may be manufactured.

In the method of manufacturing the wafer level package according to an embodiment of the present invention, a series of all processes of manufacturing a wafer level package are performed on a supporting frame such as a silicon wafer or a glass wafer, thereby reducing warpage defects that occur when a related art process of manufacturing a molding material-based wafer level package in a state of being isolated from a molding frame is being performed. Since the warpage defects are reduced, mask accuracy is enhanced in the photomask process.

Moreover, since the molding process is skipped, a total process time is shortened, and since a mold frame (or a carrier) is not used, a manufacturing process is efficiently managed.

In the method of manufacturing the wafer level package according to an embodiment of the present invention, a bump process (see FIGS. 12 to 15) using the photomask process is described, but the present embodiment is not limited thereto. As another example, a conductive bump may be formed by using a copper pillar solder bump (CPB) process of forming a pillar-shaped bump, a ball drop process using a ball drop stencil, or a screen printing process.

Figure 17:
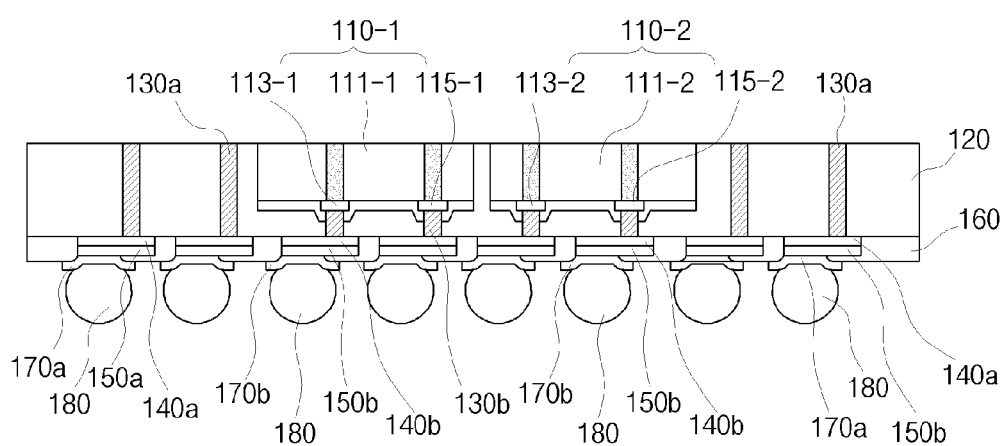
FIG. 17 is a cross-sectional view of a semiconductor package illustrating an application example of the semiconductor package of FIG. 1.

FIG. 17 is a cross-sectional view of a semiconductor package illustrating an application example of the semiconductor package of FIG. 1.

Referring to FIG. 17, an application example of a semiconductor package according to an embodiment of the present invention has a difference in that two wafer chips 110-1 and 110-2 which are arranged in a horizontal direction in the repassivation layer 120 are encapsulated in the repassivation layer 120, unlike the semiconductor package 100 of FIG. 1 where one wafer chip 110 is encapsulated in the repassivation layer 120.

In the application example of the semiconductor package, it can be understood by those skilled in the art that each of the processes of FIGS. 2 to 16 is simultaneously performed on the two wafer chips 110-1 and 110-2, and thus, the semiconductor package is manufactured. Therefore, detailed descriptions on a manufacturing method according to the application example of the semiconductor package and a structure of the semiconductor package are not provided.

Figure 18:
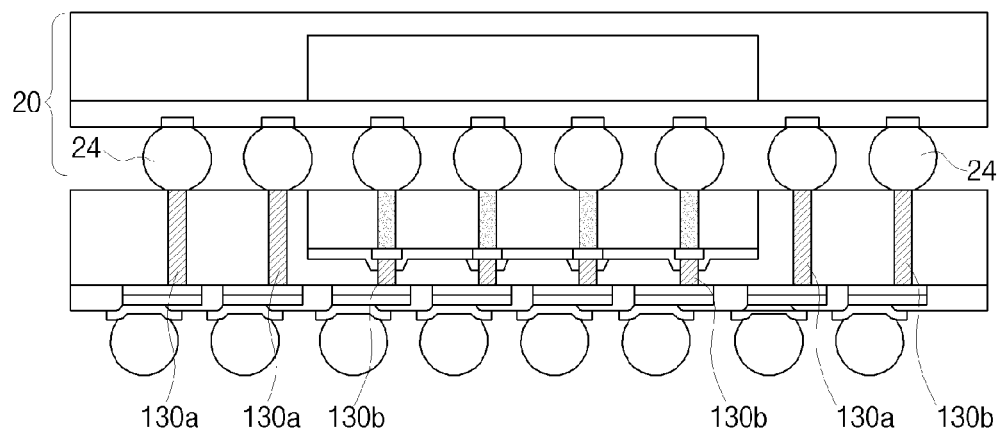
FIG. 18 is a cross-sectional view of a semiconductor package illustrating another application example of the semiconductor package of FIG. 1.

FIG. 18 is a cross-sectional view of a semiconductor package illustrating another application example of the semiconductor package of FIG. 1.

Referring to FIG. 18, another application example of a semiconductor package according to an embodiment of the present invention relates to a multi-stacked semiconductor package.

The multi-stacked semiconductor package may include the semiconductor package 100 of FIG. 1 and another semiconductor package 20 stacked thereon. For convenience, the semiconductor package 100 may be referred to as a bottom semiconductor package 100, and the other semiconductor package 20 may be referred to as a top semiconductor package 20.

The bottom semiconductor package 100 is the same as the semiconductor package 100 illustrated in FIG. 1, but unlike the semiconductor package 100 of FIG. 1, the bottom semiconductor package 100 merely has a difference in that eight TEVs 130 are formed in the first repassivation layer 120, and four TSVs are formed in a wafer chip. Therefore, the descriptions of FIGS. 1 to 16 are applied to the bottom semiconductor package 100 and a method of manufacturing the same.

The top semiconductor package 20 may include a substrate 21 where a connection pad 23 is formed on a bottom of the substrate 21, a molding material 24 that encapsulates a semiconductor chip 22 formed on the substrate 21, a top of the substrate 21, and the semiconductor chip 22, and a conductive bump 240 formed on the connection pad 23. The molding material 240 may be an epoxy molding compound (EMC).

The other ends of a TEV and a TSV formed in the bottom semiconductor package 100 may be electrically connected to each other by a reflow process using the connection pad 23 and conductive bump 24 of the semiconductor package 20. Accordingly, a multi-stacked semiconductor package where the top semiconductor package 20 is stacked on the bottom semiconductor package 100 may be manufactured.

Figure 19:
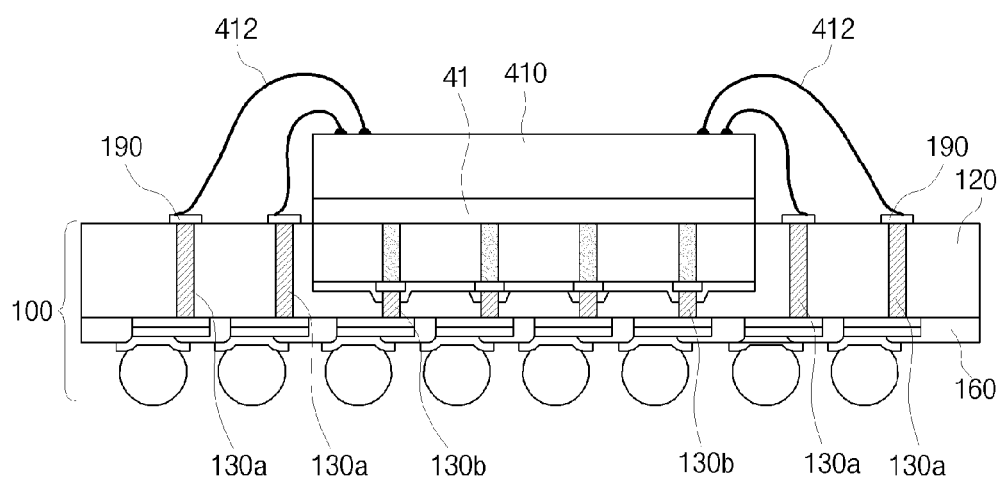
FIG. 19 is a cross-sectional view of a semiconductor package illustrating another application example of the semiconductor package of FIG. 1.

FIG. 19 is a cross-sectional view of a semiconductor package illustrating another application example of the semiconductor package of FIG. 1.

Referring to FIG. 19, another application example of a semiconductor package according to an embodiment of the present invention has a difference in that a bottom semiconductor package 100 is electrically connected to a top semiconductor chip 410 stacked thereon by a conductive wire 412, unlike the semiconductor package illustrated in FIG. 18.

In detail, the top semiconductor chip 410 may be attached to a top of the bottom semiconductor package 100 by a DAF 41. In this case, the top semiconductor chip 410 may be insulated from the bottom semiconductor package 100 by the DAF 41.

Subsequently, the conductive wire 412 extending from the top semiconductor chip 410 may be stitch-bonded to a connection pad 190 formed on the top of the bottom semiconductor package 100 through a wire bonding process.

Therefore, a multi-stacked semiconductor package where the bottom semiconductor package 100 is electrically connected to the top semiconductor chip 410 may be implemented.

Figure 16:
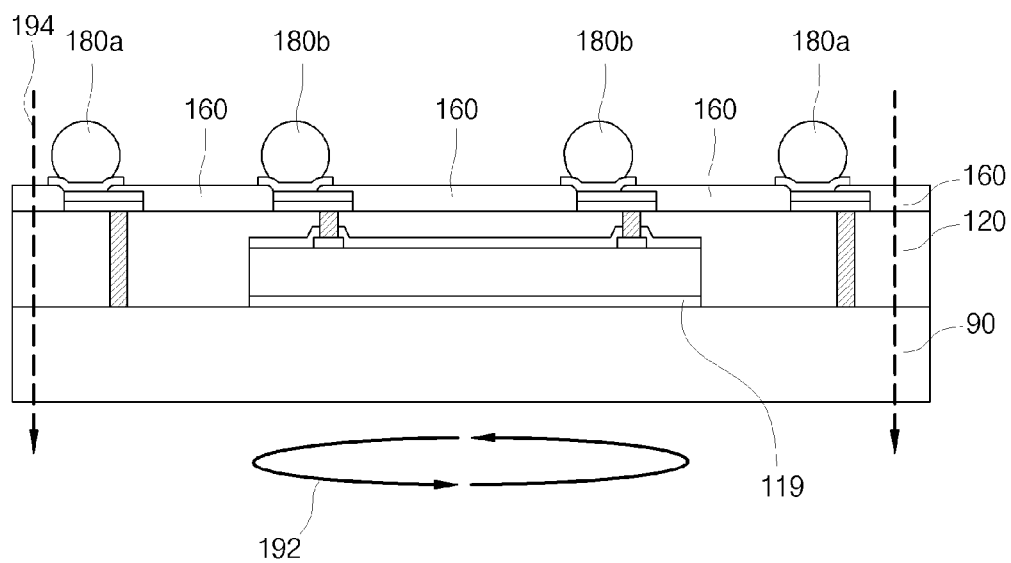

Here, the connection pad 190 may be formed in a wafer manufacturing process performed by a wafer manufacturer, or after the back grinding process of FIG. 16 is performed, the connection pad 190 may be formed all over a wafer level package which is exposed by removing a silicon wafer 90 and a DAF 117.

Figure 20:
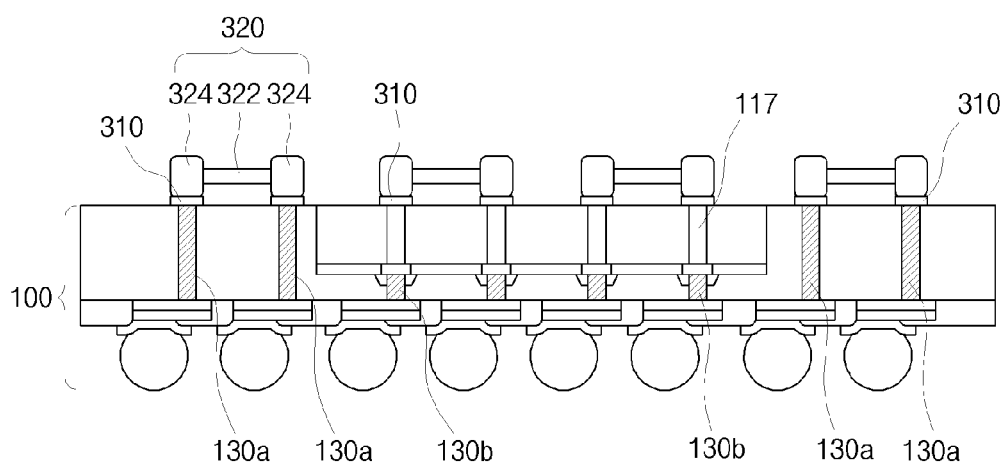
FIG. 20 is a cross-sectional view of a semiconductor package illustrating another application example of the semiconductor package of FIG. 1.

FIG. 20 is a cross-sectional view of a semiconductor package illustrating another application example of the semiconductor package of FIG. 1.

Referring to FIG. 20, another application example of a semiconductor package according to an embodiment of the present invention has a structure where a plurality of elements 310 are stacked on the semiconductor package 100.

An element 320 may include a passive element 322 and an electrode 324. The passive element may be a capacitor or an inductor. The element 320 may include an active element instead of the passive element. In this case, the active element may be an integrated circuit (IC).

The electrode 324 included in the element 320 may be electrically connected to a connection pad 310. Therefore, the element 320 may be electrically connected to, through the connection pad 310, a plurality of TEVs 130a passing the first repassivation layer 120 and a plurality of TSVs 117 passing through a semiconductor chip 110B.

Figure 21:
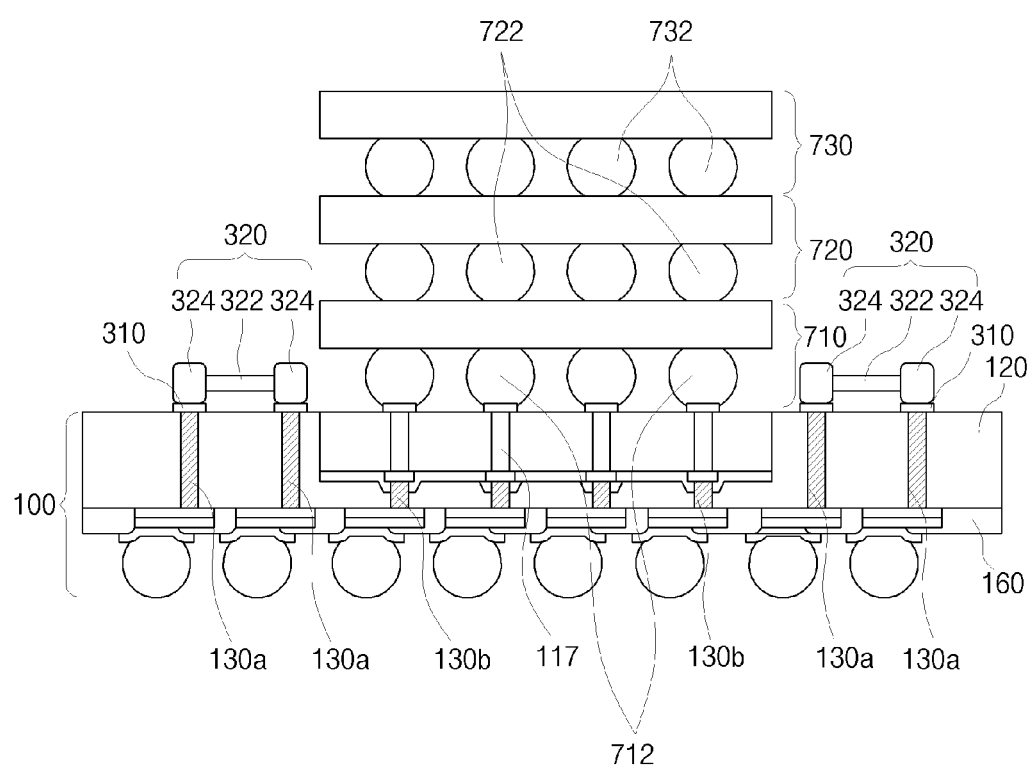
FIG. 21 is a cross-sectional view of a semiconductor package illustrating another application example of the semiconductor package of FIG. 1.

FIG. 21 is a cross-sectional view of a semiconductor package illustrating another application example of the semiconductor package of FIG. 1.

Referring to FIG. 21, another application example of a semiconductor package according to an embodiment of the present invention has a difference with the multi-stacked semiconductor package of FIG. 18 in that a plurality of semiconductor chips 710, 720 and 730 in addition to an element 320 are stacked on a semiconductor package 100.

In the other application example, a TEV 130a passing through the repassivation layer 120 may be electrically connected to the element 320 by a connection pad 310, and a TSV 117 passing through a wafer chip may be electrically connected to, by the connection pad 310, a conductive bump 712 of a semiconductor chip 710, which is disposed at a lowermost position, among the plurality of semiconductor chips 710, 720 and 730. In this case, the semiconductor chip 710 may be electrically connected to the semiconductor chip 720 stacked thereon by a conductive bump 722, and the semiconductor chip 720 may be electrically connected to the semiconductor chip 730 stacked thereon by a conductive bump 732.

Therefore, a multi-stacked semiconductor package 700 where the element 320 and the plurality of semiconductor chips 710, 720 and 730 are stacked on the semiconductor package 100 may be implemented.

Figure 22:
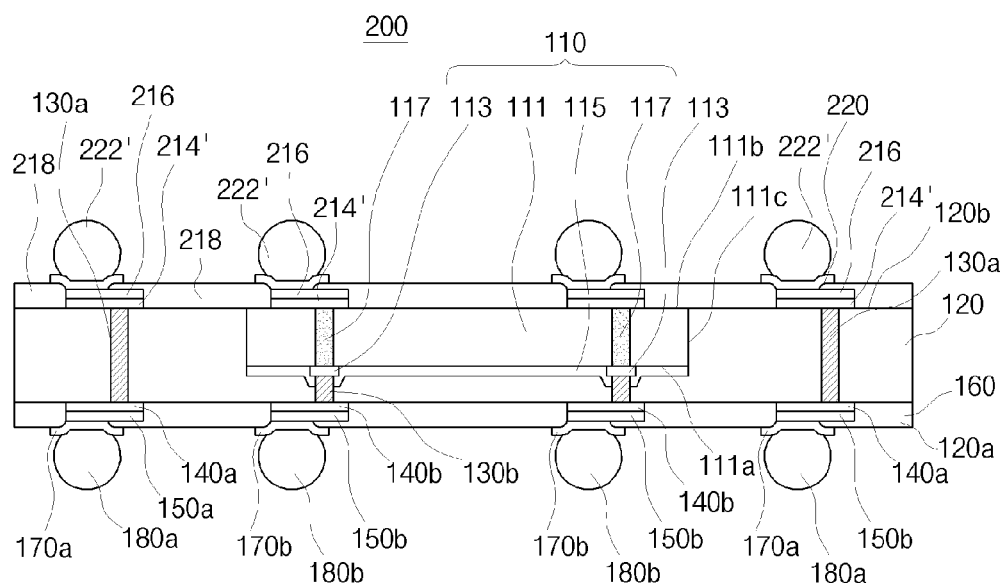
FIG. 22 is a cross-sectional view of each of a plurality of semiconductor packages isolated from a fan-out type wafer level package manufactured according to another embodiment of the present invention.

FIG. 22 is a cross-sectional view of each of a plurality of semiconductor packages isolated from a fan-out type wafer level package manufactured according to another embodiment of the present invention. For conciseness of a description, details repetitive of the above-described details of FIG. 1 will be briefly described.

Referring to FIG. 22, a semiconductor package 200 according to another embodiment of the present invention has a difference in that a conductive bump is formed under a semiconductor package 100 and another conductive bump is also formed on the semiconductor package 100, unlike the semiconductor package 100 of FIG. 1 where the conductive bump is formed only under the semiconductor package 100.

In detail, the semiconductor package 200 according to another embodiment of the present invention may include a repassivation layer 120 that encapsulates a wafer chip 110, a top layer structure that is formed on a first surface 120a of the repassivation layer 120, and a bottom layer structure that is formed on a second surface 120b of the repassivation layer 120.

The descriptions made with reference to FIG. 1 are applied to the wafer chip 110 and the repassivation layer 120.

Bottom Layer Structure

The bottom layer structure may provide a redistribution path that electrically connects one end of the TEV 130, passing through the inside of the repassivation layer 120, to various options (not shown) stacked under the semiconductor package 200. Here, the options may include another package, another semiconductor chip, an element, a substrate, and/or the like.

The bottom layer structure may include a bottom redistribution seed layer 140 that is formed on the second surface 120b of the repassivation layer 120, a bottom RDL 150 that is formed on the bottom redistribution seed layer 140, a bottom repassivation layer 160 that exposes a partial region of the bottom RDL 150, a bottom UBM layer 170 (170a and 170b) that is formed in a partial region of the bottom RDL 150, and a bottom bump 180 that is formed on the bottom UBM layer 170.

The bottom redistribution seed layer 140 is a seed for forming the RDL 150 (150a and 150b) and may be formed on the first surface 120a of the repassivation layer 120. The bottom redistribution seed layer 140 may include a first bottom redistribution seed layer 140a and a second bottom redistribution seed layer 140b. The first bottom redistribution seed layer 140a may be formed on the second surface 120b of the repassivation layer 120 and may be electrically connected to one end of the first TEV 130a exposed to on the repassivation layer 120. The second bottom redistribution seed layer 140b may be formed on the second surface 120b of the repassivation layer 120 and may be electrically connected to one end of the second TEV 130b exposed to on the repassivation layer 120.

The bottom RDL 150 may be formed on the bottom redistribution seed layer 140 and may be electrically connected to the bottom redistribution seed layer 140. The bottom RDL 150 may redistribute an electrical connection path between an input/output pad 113 of a semiconductor chip 111 and the bottom bump 180 irrespective of a position of the input/output pad 113 of the semiconductor chip 111. The bottom RDL 150 may include a first bottom RDL 150a and a second bottom RDL 150b. The first bottom RDL 150a may be formed on the first bottom redistribution seed layer 140a and may be electrically connected to the first bottom redistribution seed layer 140a. The second bottom RDL 150b may be formed on the second bottom redistribution seed layer 140b and may be electrically connected to the second bottom redistribution seed layer 140b.

The bottom repassivation layer 160 may be formed on the first surface 120a of the repassivation layer 120 and may expose a partial region of the bottom RDL 150.

The bottom UBM layer 170 is a layer that induces deposition of the bottom bump 180. The bottom UBM layer 170 may be formed in a partial region of the bottom RDL 150 exposed by the bottom repassivation layer 160 and may be electrically connected to the bottom RDL 150. The bottom UBM layer 170 may include a first bottom UBM layer 170a and a second bottom UBM layer 170b. The first bottom UBM layer 170a may be formed in a partial region of the first bottom RDL 150a exposed by the bottom repassivation layer 160 and may be electrically connected to the first bottom RDL 150a. The second bottom UBM layer 170b may be formed in a partial region of the second bottom RDL 150b exposed by the bottom repassivation layer 160 and may be electrically connected to the second bottom RDL 150b.

The bottom bump 180 (180a and 180b) may be formed on the UBM layer 170 and may be electrically connected to the UBM layer 170.

Top Layer Structure

The top layer structure may provide a redistribution path that electrically connects the other end of the TEV 130 passing through the inside of the repassivation layer 120 and the other end of the TSV 117, passing through the inside of the semiconductor chip 111, to various options (not shown) stacked on the semiconductor package 100. Here, the options may include another package, another semiconductor chip, an element, a substrate, and/or the like.

The top layer structure may include a top redistribution seed layer 214' that is formed on the second surface 120b of the repassivation layer 120, a top RDL 216 that is formed on the top redistribution seed layer 216, a top repassivation layer 218 that exposes a partial region of the top RDL 216, a top UBM layer 220 that is formed in a partial region of the top RDL 218, and a top bump 220' that is formed on the top UBM layer 220.

The top redistribution seed layer 214' is a seed for forming the top RDL 216 and may be formed on the second surface 120b of the repassivation layer 120. The top redistribution seed layer 214' may be electrically connected to the other end of the first TEV 130a exposed to on the repassivation layer 120 and may be electrically connected to the other end of the TSV 117 exposed to on the second surface 111b of the semiconductor chip 111.

The top RDL 216 may be formed on the top redistribution seed layer 214' and may be electrically connected to the top redistribution seed layer 214'. Therefore, the top RDL 216 may be electrically connected to the other end of the TEV 130 by the top redistribution seed layer 214'. Also, the top RDL 216 may be electrically connected to the other end of the TSV 117 by the top redistribution seed layer 214'. The top RDL 216 may redistribute an electrical connection path between the semiconductor chip 111 and a top bump 222'.

The top repassivation layer 218 may be formed on the repassivation layer 120 and may expose a partial region of the bottom RDL 150.

The top UBM layer 220 is a layer that induces deposition of the top bump 222'. The top UBM layer 220 may be formed in a partial region of the top RDL 216 exposed by the top repassivation layer 218 to be electrically connected to the top RDL 216.

The top bump 222' may be formed on the top UBM layer 220 to be electrically connected to the top UBM layer 220.

In the semiconductor package 200 according to another embodiment of the present invention, the top layer structure may be electrically connected to the top layer structure by the TSV 117 passing through the semiconductor chip 111 and the TEV 113 passing through the repassivation layer 120. Therefore, the semiconductor package 100 may act as an interposer that adjusts an electrical connection path between options stacked thereon and options stacked thereunder.

FIGS. 23 to 47 are cross-sectional views illustrating a method of manufacturing a fan-out type wafer level package for manufacturing the semiconductor package of FIG. 22, according to another embodiment of the present invention.

In each of the cross-sectional views, only one wafer chip is illustrated. This is for helping understand the present invention. It should be noted that each of the following processes is simultaneously performed for a plurality of wafer chips isolated from a wafer in an actual process.

The method of manufacturing the fan-out type wafer level package according to another embodiment of the present invention illustrated in FIGS. 23 to 26 is substantially the same as the method of manufacturing the fan-out type wafer level package according to an embodiment of the present invention illustrated in FIGS. 2 to 5. Also, FIGS. 27 to 36 illustrate a method of manufacturing the bottom layer structure of the semiconductor package 200 illustrated in FIG. 22, and the method is substantially the same as the method of manufacturing the fan-out type wafer level package according to an embodiment of the present invention illustrated in FIGS. 6 to 15. FIGS. 37 to 47 are cross-sectional views for describing a method of manufacturing the top layer structure of the semiconductor package 200 illustrated in FIG. 22.

In describing the method of manufacturing the fan-out type wafer level package according to another embodiment of the present invention, details repetitive of the above-described details of FIGS. 2 to 16 will be briefly described.

Figure 23:
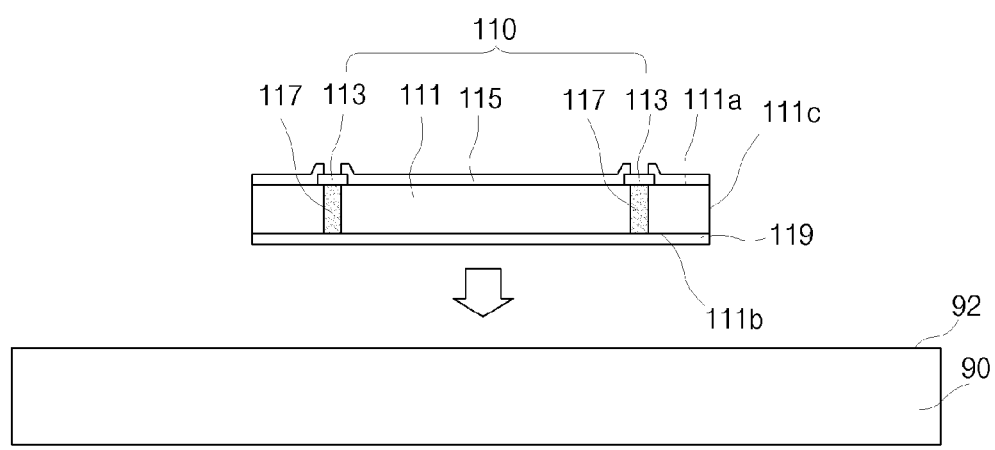
FIGS. 23 to 47 are cross-sectional views illustrating a method of manufacturing a fan-out type wafer level package for manufacturing the semiconductor package of FIG. 22, according to another embodiment of the present invention.

First, referring to FIG. 23, a process of attaching a plurality of semiconductor chips 110, isolated from a wafer level package, to a supporting frame 90 may be performed. In the drawing, only one wafer chip 110 is illustrated.

A DAF 119 may be coated on a second surface 111b of each of the plurality of semiconductor chips 111, and the semiconductor chips 111 may be attached to a surface 92 of the supporting frame 90 by the DAF 119. The supporting frame 90 may use a silicon wafer or a glass wafer.

Figure 24:
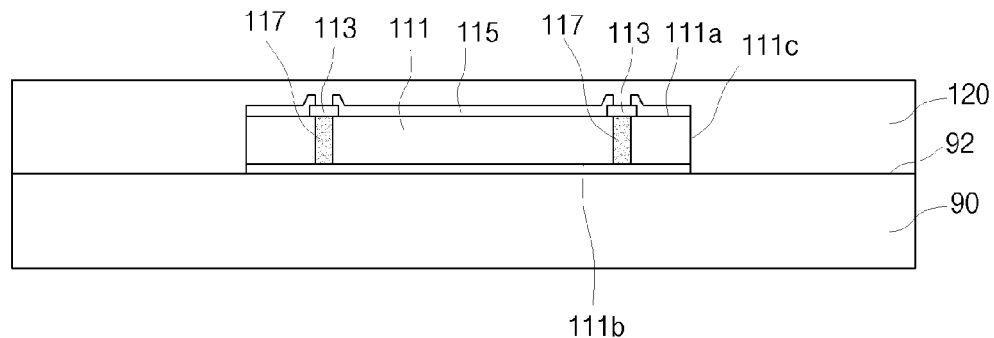

Subsequently, referring to FIG. 24, a process of forming a repassivation layer 120 that encapsulates a surface 92 of the supporting frame 90, an input/output pad 113 formed on a first surface 111a of the semiconductor chip 111, a passivation layer 115, and a side surface 111c of the semiconductor chip 111 may be performed. A method of forming the repassivation layer 120 may use the coating process or the CVD process. The repassivation layer 120 may be formed of polyimide (PI), benzo cyclo butene (BCB), poly benz oxazole (PBO), bismaleimidetriazine (BT), phenolic resin, epoxy, silicon, silicon oxide ($SiO_2$), silicon nitride ($Si_3N_4$), or a combination thereof.

Figure 25:
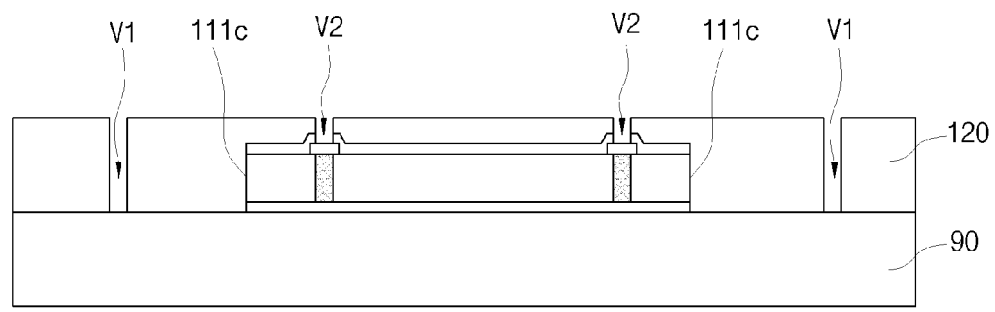

Subsequently, referring to FIG. 25, a process of forming a plurality of interposer via holes V1 and V2 passing through the inside of the repassivation layer 120 may be performed. The interposer via holes V1 and V2 may be formed by using a laser drilling process or a photomask process including an exposure process and a development process. The interpose via holes V1 and V2 may include a first interposer via hole V1 and a second interposer via hole V2. The first interposer via hole V1 may be formed to be separated from the side surface 111c of the semiconductor chip 111 by a certain interval. The second interposer via hole V2 may be formed on the input/output pad 113 of the semiconductor chip 111. Therefore, the input/output pad 113 may be exposed to an upper portion by the second interposer via hole V2.

Figure 26:
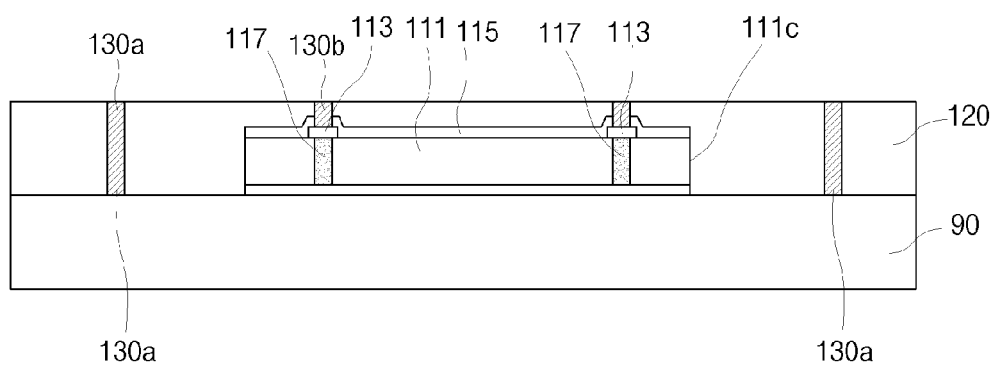

Subsequently, referring to FIG. 26, a process of forming a TEV 130 (130a and 130b) by filling a conductive material into the interposer via holes V1 and V2 may be performed. The conductive material may be metal or a metal post. A method of forming the metal or the metal post in the interposer via holes V1 and V2 may use an electroplating process or an electroless plating process. According to another embodiment, the conductive material may be a melting metal. The melting metal may be filled into the interposer via holes V1 and V2, and then, the TEV 130 (130a and 130b) may be formed by cooling the melting metal. One end of the conductive material filled into the interposer via holes V1 and V2 may be exposed to on the first surface 120a of the first repassivation layer 120.

Method of Manufacturing Bottom Layer Structure

Figure 27:
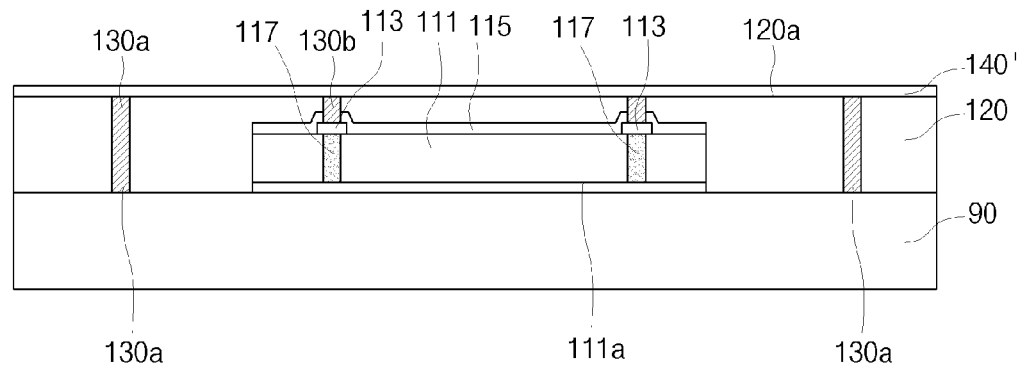

Subsequently, referring to FIG. 27, a bottom metal seed layer 140' may be formed all over a first surface 120a of the repassivation layer 120. Therefore, the bottom metal seed layer 140' may be electrically connected to one end of the TEV 130 (130a and 130b) exposed to on the repassivation layer 120. The bottom metal seed layer 140' may be formed by the PVD process or the CVD process.

Figure 28:
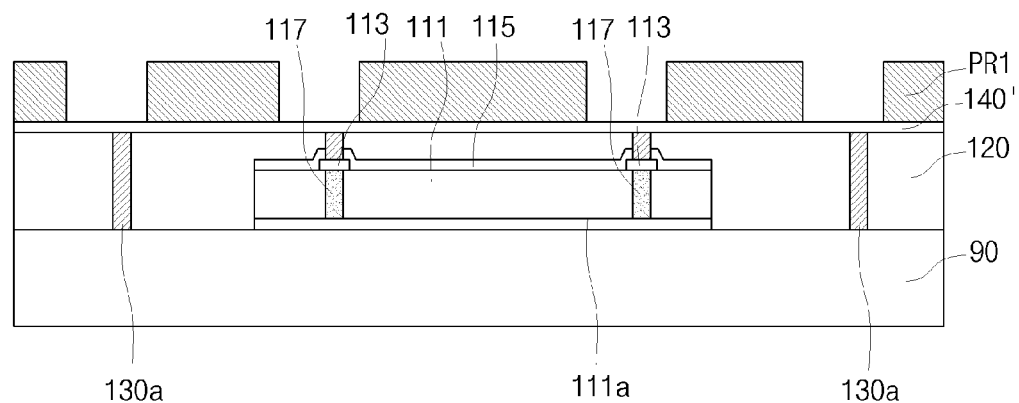

Subsequently, referring to FIG. 28, a process of forming a first photoresist layer PR1 on the bottom metal seed layer 140' may be performed. The first photoresist layer PR1 may be formed all over the bottom metal seed layer 140', and an exposure area EA1 of the first photoresist layer PR1 may be removed by the exposure process and the development process.

Figure 29:
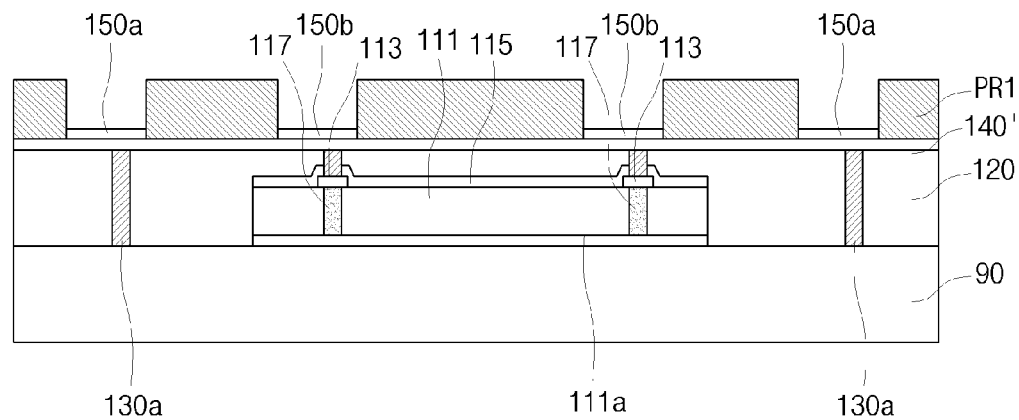

Subsequently, referring to FIG. 29, a process of forming a bottom RDL 150 (150a and 150b) on the bottom metal seed layer 140' which is exposed by removing the exposure area EA1 of the first photoresist layer PR1 may be performed. A method of forming the bottom RDL 150 (150a and 150b) may use the electroplating process or the electroless plating process. In the present embodiment, the electroplating process is assumed as being used.

Figure 30:
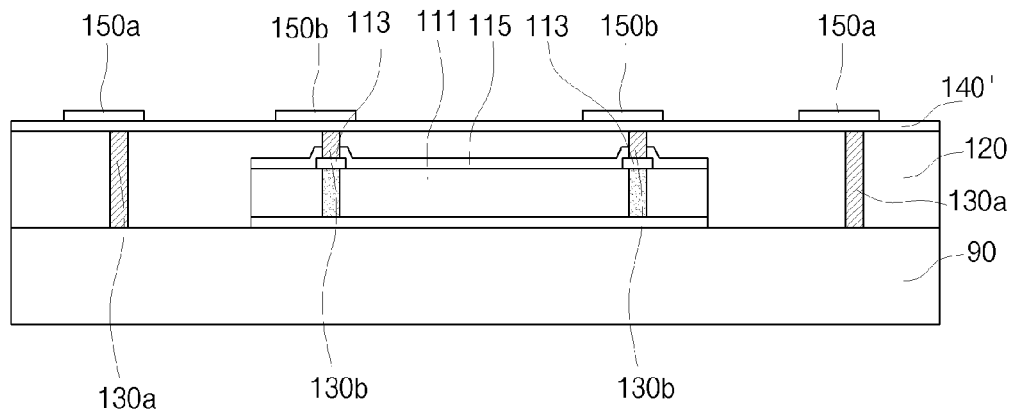

Subsequently, referring to FIG. 30, a process of removing the first photoresist layer PR1 formed on the bottom metal seed layer 140' may be performed. A method of removing the first photoresist layer PR1 may use a dry etching process or a wet etching process.

Figure 31:
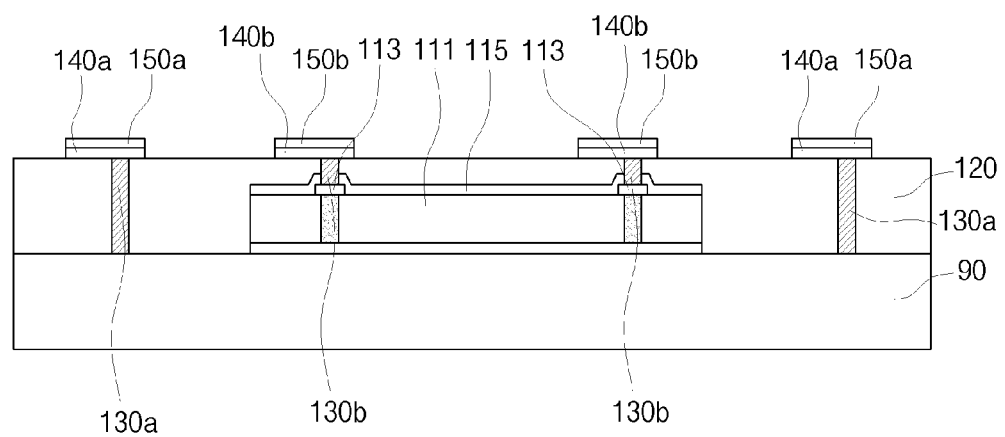

Subsequently, referring to FIG. 31, a process of removing the bottom metal seed layer 140' which is exposed by removing the first photoresist layer PR1 may be performed. A method of removing the bottom metal seed layer 140' may use the wet etching process or the dry etching process.

Hereinafter, for clarity of a name of a layer, the bottom metal seed layer 140' which is left after the bottom metal seed layer 140' which is exposed by removing the first photoresist layer PR1 is removed may be referred to as a bottom redistribution seed layer, which is referred to by reference numeral 140.

Figure 32:
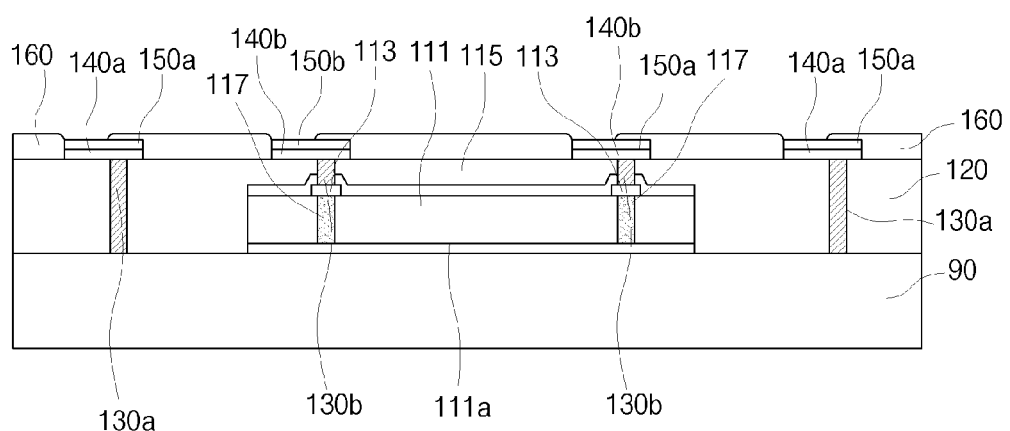

Subsequently, referring to FIG. 32, a process of forming the repassivation layer 120 which is exposed by removing the bottom metal seed layer 140' and a bottom repassivation layer 160 exposing a partial region of a bottom RDL 150 (150a and 150b) may be performed. A method of forming the bottom repassivation layer 160 may use a photomask process including the exposure process and the development process.

Figure 33:
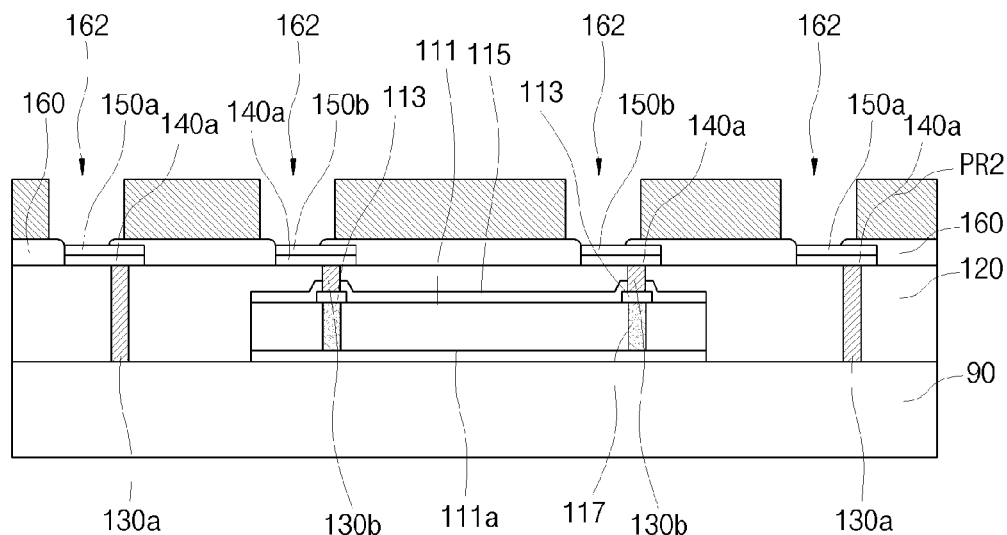

Subsequently, referring to FIG. 33, a process of forming a second photoresist layer PR2 on the bottom repassivation layer 160 may be performed. The second photoresist layer PR2 may be formed to have a uniform height and may include a contact hole 162 that exposes a partial region of the bottom RDL 150 (150a and 150b) exposed by the bottom repassivation layer 160. A method of forming the second photoresist layer PR2 including the contact hole 162 may use the photomask process including the exposure process and the development process.

Figure 34:
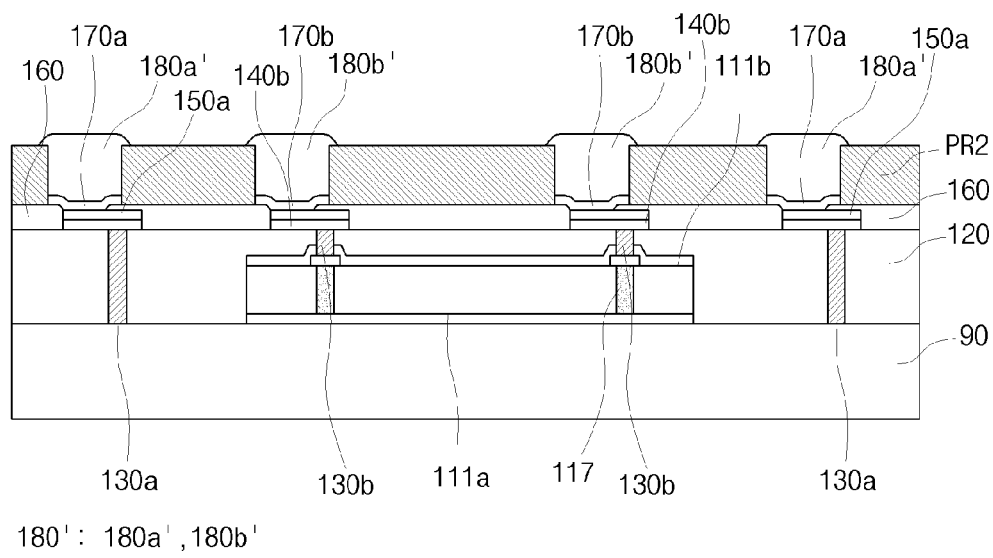

Subsequently, referring to FIG. 34, a bottom UBM layer 170 (170a and 170b) and a bottom bump material 180' (180a' and 180b') may be sequentially formed in the contact hole 162. A method of forming the bottom UBM layer 170 (170a and 170b) and the bottom bump material 180' (180a' and 180b') may use the electroplating process or the electroless plating process. Here, in a case of using the electroplating process, a bottom UBM seed layer (not shown) may be further formed between the bottom RDL 150 (150a and 150b) and the bottom UBM layer 170 (170a and 170b). The bottom bump material 180' (180a' and 180b') may be Al, Sn, Ni, Au, Ag, Pb, Bi, Cu, solder, or a combination thereof.

Figure 35:
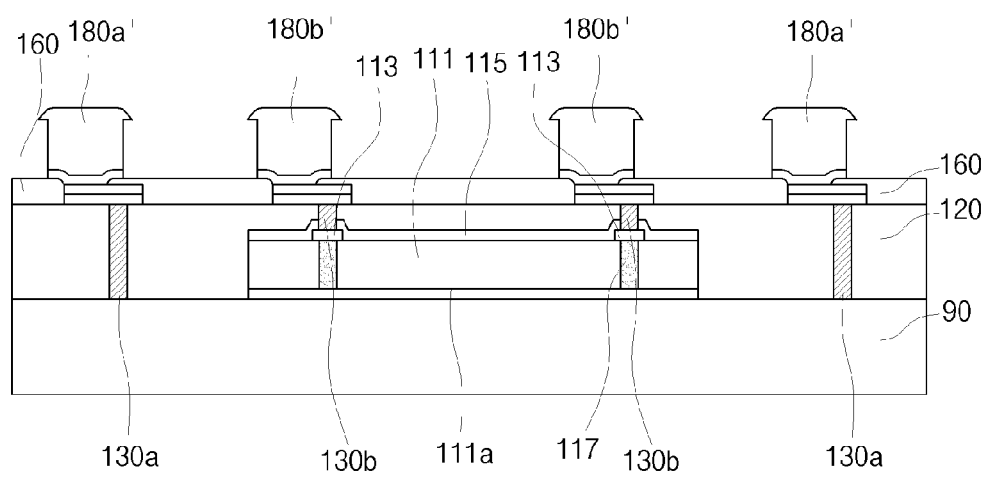

Subsequently, referring to FIG. 35, a process of forming the second photoresist layer PR2 including the contact hole 162 may be performed. A method of removing the second photoresist layer PR2 may use the dry etching process or the wet etching process. Since the second photoresist layer PR2 is removed, only the bottom bump material 180' (180a' and 180b') having a cross-sectional profile of the contact hole 162 may remain.

Figure 36:
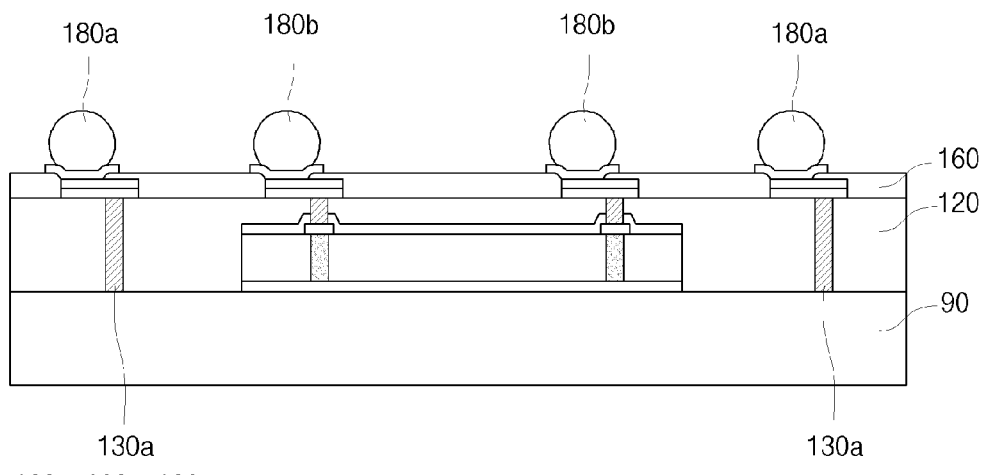

Subsequently, referring to FIG. 36, a process of forming a bottom bump 180 having a round shape from the bottom bump material 180' may be performed by using the reflow process and the flux cleaning process. Therefore, a wafer level package where the bottom layer structure is provided may be finished.

Method of Manufacturing Top Layer Structure

Figure 37:
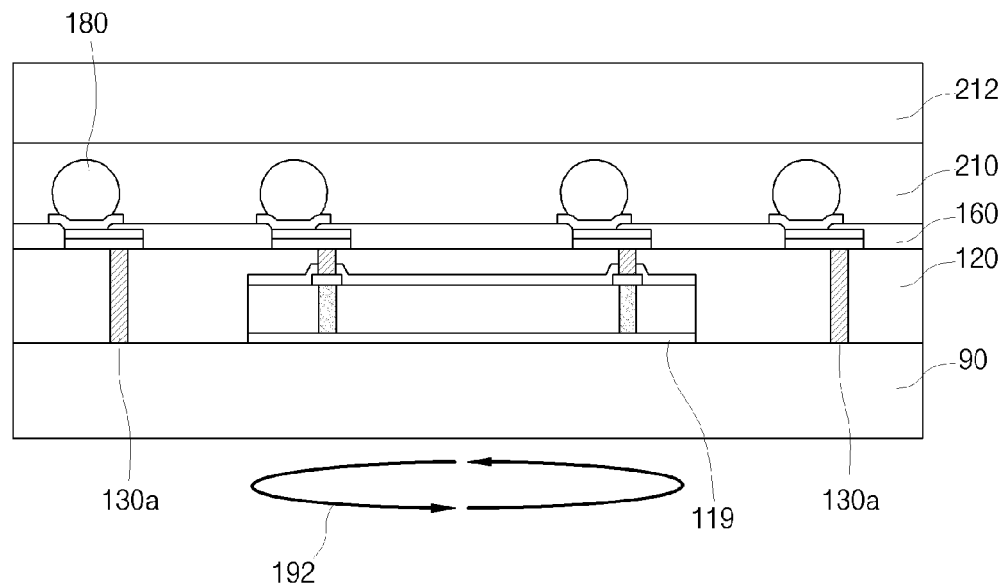

Subsequently, referring to FIG. 37, a DAF 210 may be coated on the bottom bump 180, and the wafer level package where the bottom layer structure is provided may be attached to a supporting frame 212 by the DAF 210. Subsequently, the supporting frame 90 which is used in an operation of forming the bottom layer structure and the DAF 119 attached to the first surface 111a of the semiconductor chip may be sequentially removed. A method of removing the supporting frame 90 may use the back grinding 192 process, and the DAF 119 may be removed by an ultraviolet (UV) process or a heating process using heat.

Figure 38:
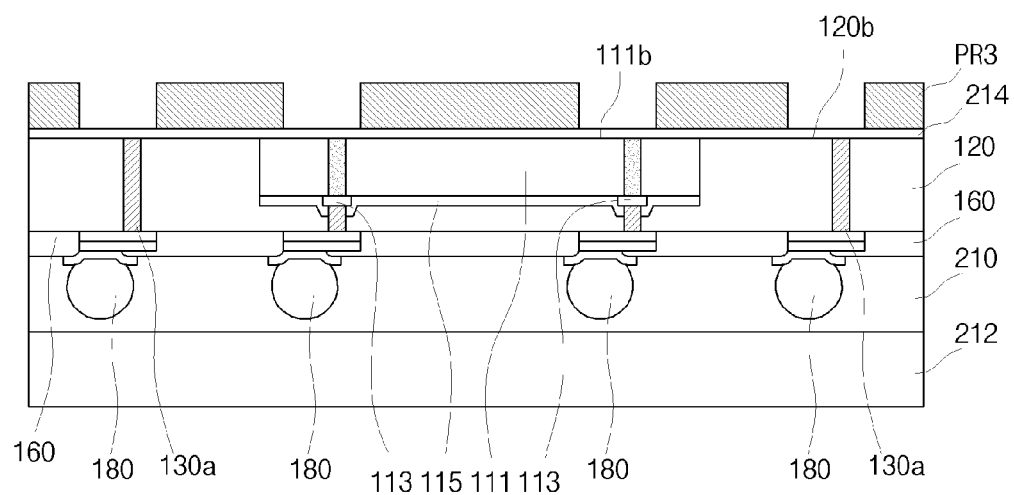

Subsequently, referring to FIG. 38, a top metal seed layer 214 may be formed all over the second surface 111b of the semiconductor chip 111 and the second surface 120b of the repassivation layer 120 exposed by removing the supporting frame 90 and the DAF 119. In this case, the top metal seed layer 214 may be electrically connected to the other end of the TEV 130 (130a and 130b) exposed to on the passivation layer 120 and the other end of the TSV 117 exposed to on the semiconductor chip 111.

Subsequently, a third photoresist layer PR3 may be formed all over the top metal seed layer 214, and then, an exposure area of the third photoresist layer PR3 may be removed by using the exposure process and the development process.

Figure 39:
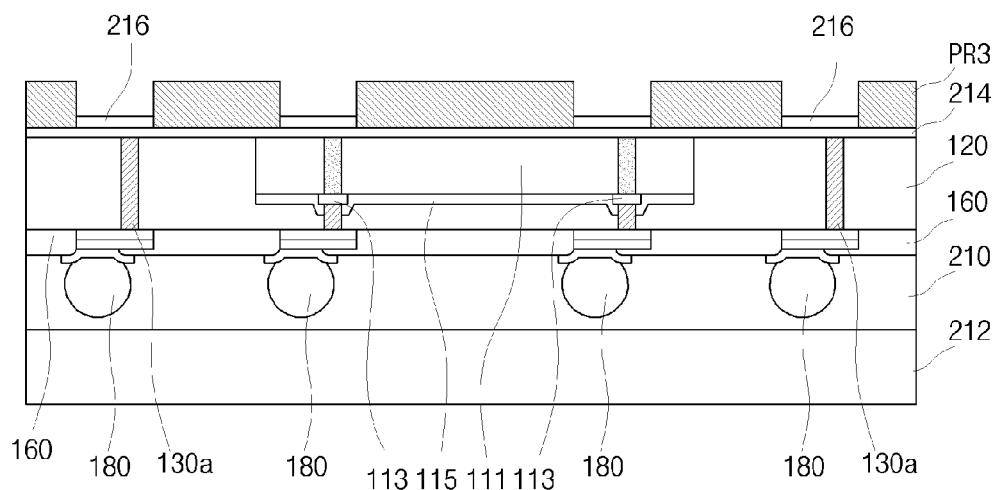

Subsequently, referring to FIG. 39, a top RDL 216 may be formed on the top metal seed layer 214 which is exposed by removing the exposure area of the third photoresist layer PR3. Here, a method of forming the top RDL 216 may use the electroplating process or the electroless plating process.

Figure 40:
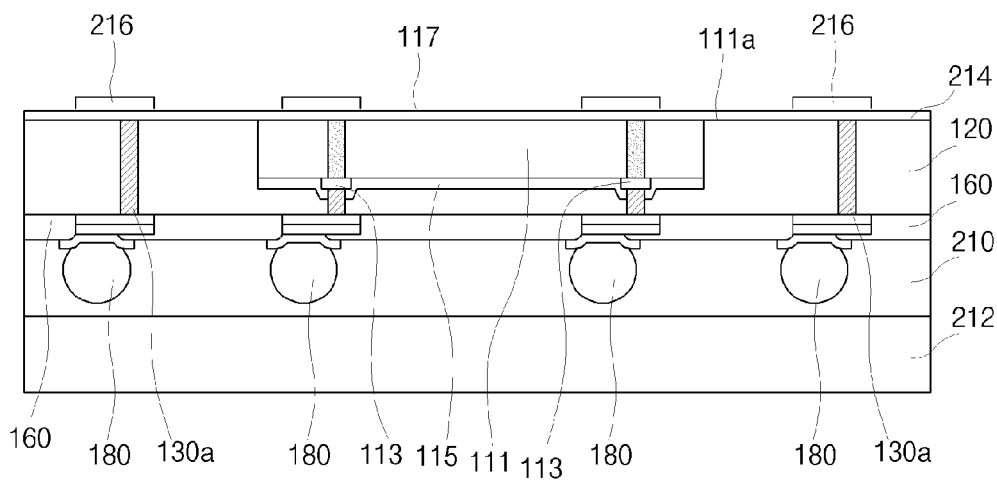

Subsequently, referring to FIG. 40, the third photoresist layer PR3 on the top metal seed layer 214 may be removed. A method of removing the third photoresist layer PR3 may use the wet etching process or the dry etching process.

Figure 41:
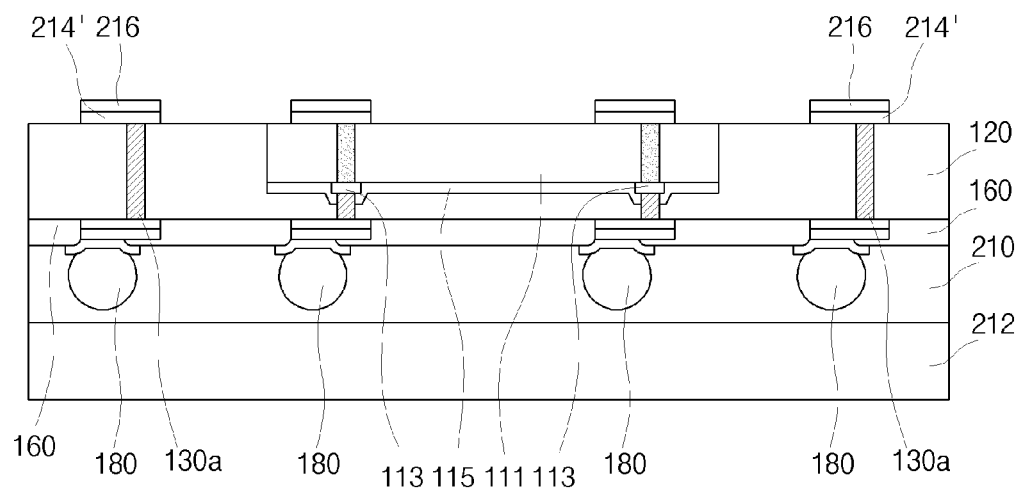

Subsequently, referring to FIG. 41, the top metal seed layer 214 which is exposed by removing the third photoresist layer PR3 may be removed. A method of removing the exposed top metal seed layer 214 may use the wet etching process or the dry etching process.

Hereinafter, in order to clearly distinguish terms and layers, the top metal seed layer 214 which is left on the top RDL 216 in a process of etching the top metal seed layer 214 may be referred to as a top redistribution seed layer, which is referred to by reference numeral 214'.

Figure 42:
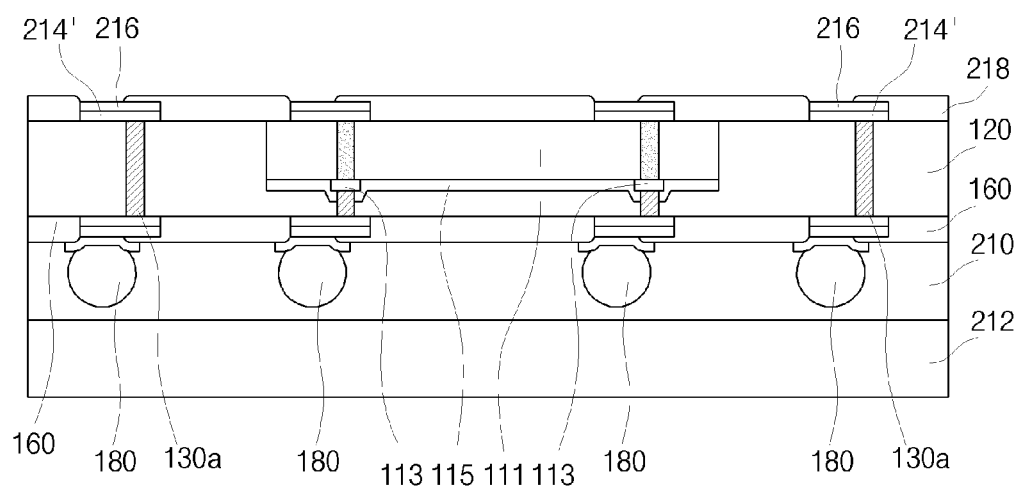

Subsequently, referring to FIG. 42, a top repassivation layer 218 may be formed on the top RDL 216 and the repassivation layer 120 exposed by removing the top metal seed layer 140'. In this case, the top repassivation layer 218 may be formed to expose a partial region of the top RDL 216. A method of forming the top repassivation layer 218 may use the photomask process.

Figure 43:
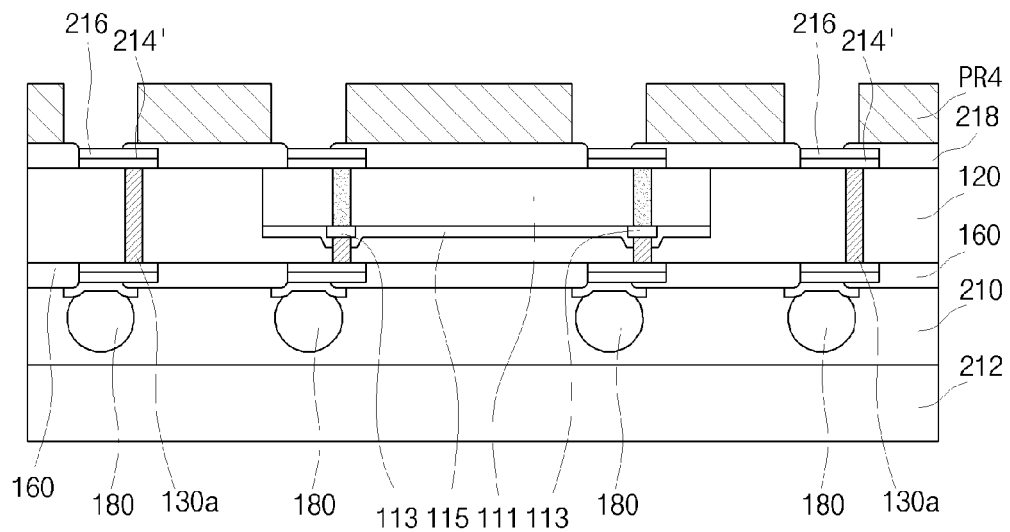

Subsequently, referring to FIG. 43, a fourth photoresist layer PR4 where a contact hole exposing the top RDL 216 is formed may be formed on the top repassivation layer 218.

Figure 44:
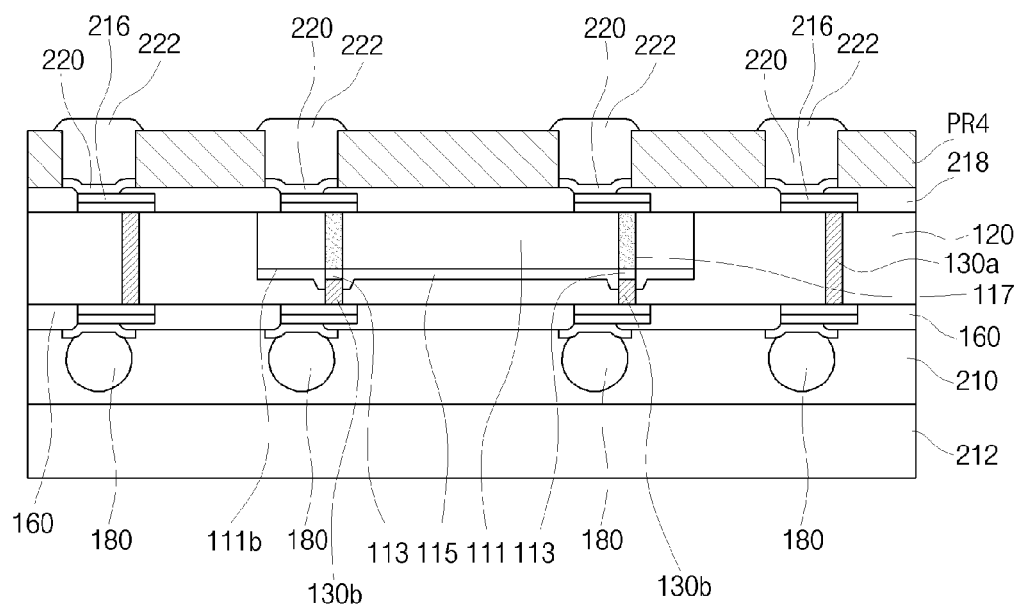

Subsequently, referring to FIG. 44, a top UBM layer 220 and a top bump material 222 may be sequentially formed in the contact hole. A method of forming the top UBM layer 220 and the top bump material 222 may use the electroplating process or the electroless plating process.

Figure 45:
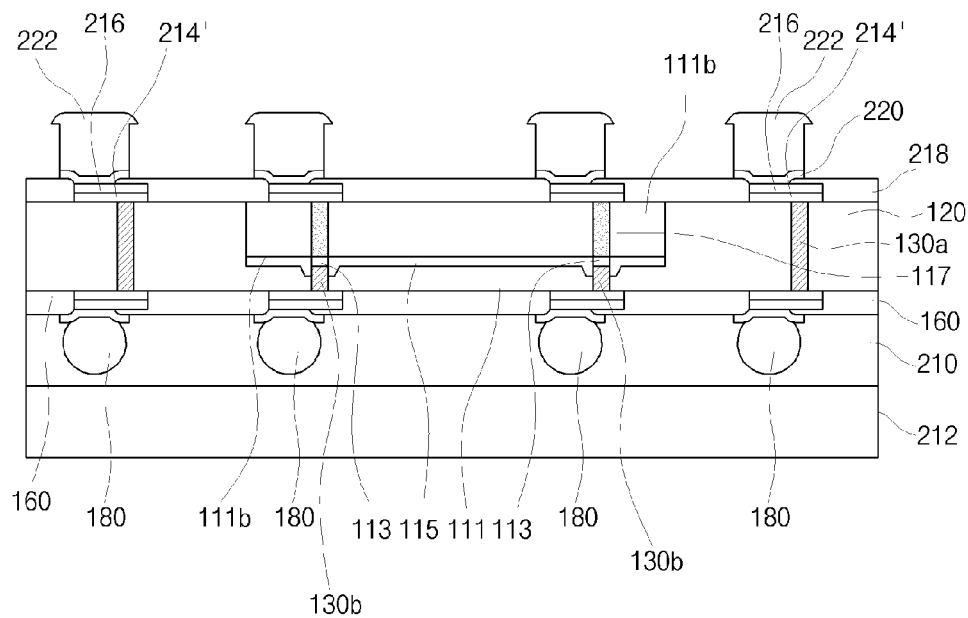
Figure 46:
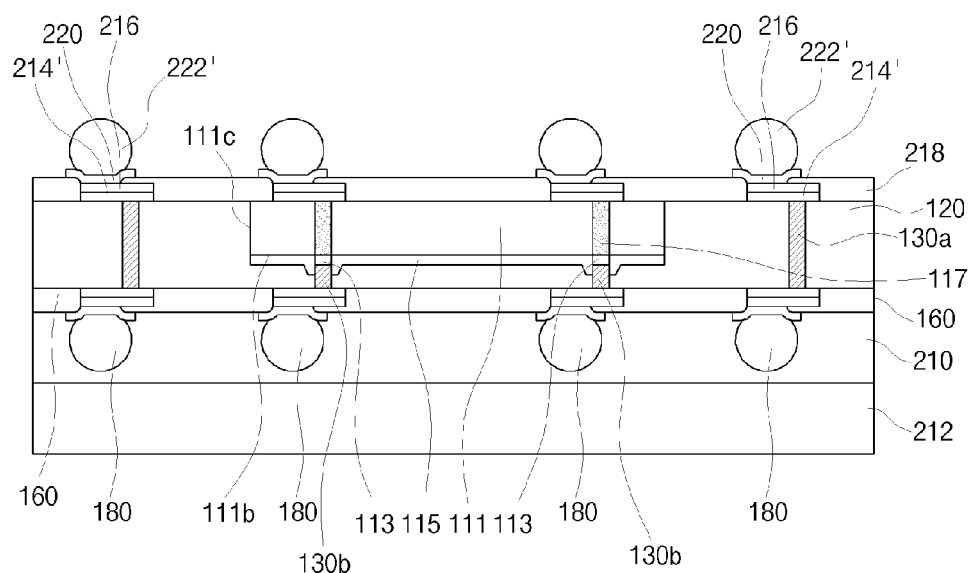
Figure 47:
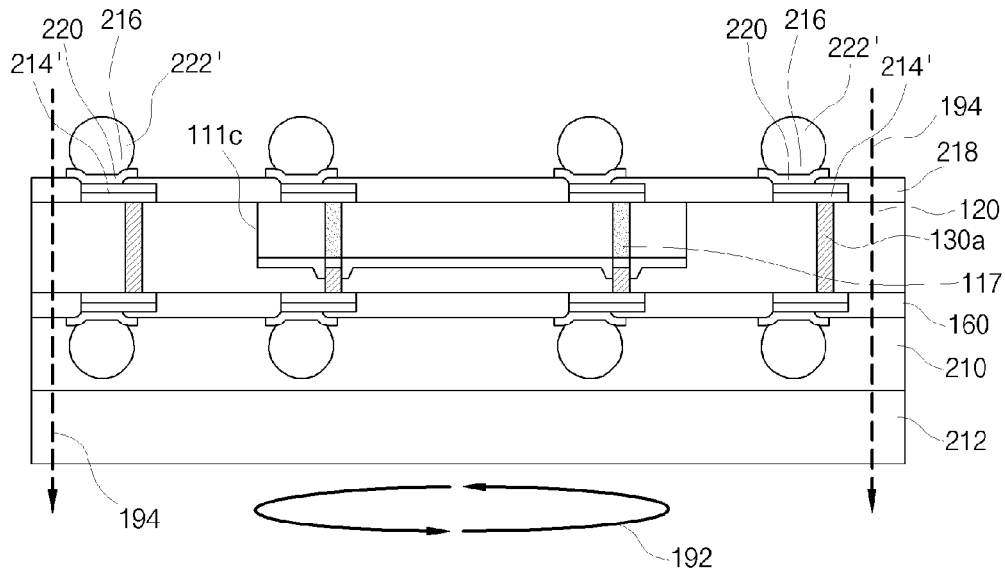

Subsequently, referring to FIG. 45, the fourth photoresist layer PR4 where the contact hole is formed may be removed. A method of removing the fourth photoresist layer PR4 may use the wet etching process or the dry etching process Subsequently, referring to FIG. 46, a top bump 222' may be formed by the same method as the method described above with reference to FIG. 36. Therefore, all processes of forming the top layer structure which are performed on the supporting frame 212 may be completed.

Subsequently, referring to FIG. 37, the supporting frame 212 and the DAF 210 may be sequentially removed. The supporting frame 212 may be removed by using the back grinding 192 process, and the DAF 119 may be removed by UV or heat.

Subsequently, a wafer level package where the top layer structure and the bottom layer structure are provided may be singularized into a plurality of semiconductor packages along a dicing line 194, and thus, the semiconductor package 200 illustrated in FIG. 22 may be manufactured.

In the method of manufacturing the wafer level package according to another embodiment of the present invention, a bump process of forming the top bump and the bottom bump by using the electroplating process or the electroless plating process is described, but the present embodiment is not limited thereto. As another example, the top bump and the bottom bump may be formed by using the CPB process of forming a pillar-shaped bump, the ball drop process using a ball drop stencil, or the screen printing process.

Figure 48:
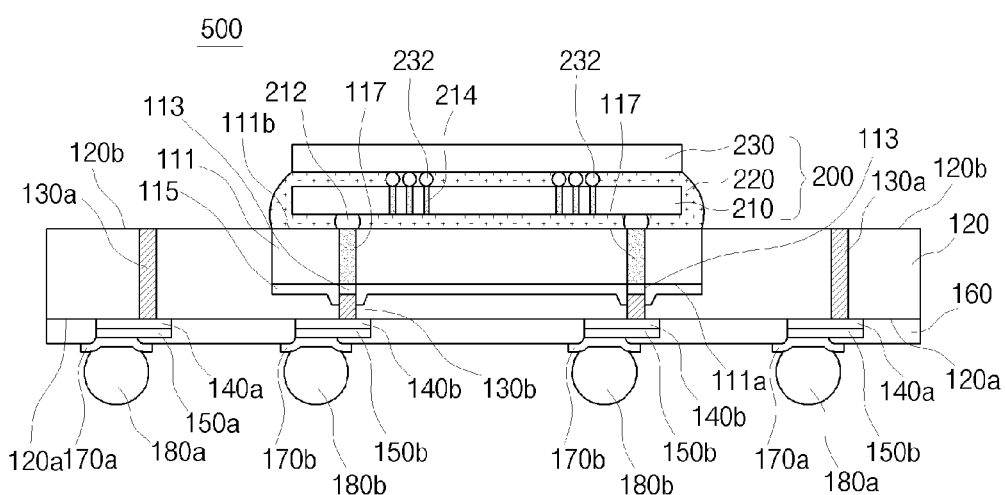
FIG. 48 is a cross-sectional view of each of a plurality of semiconductor packages isolated from a fan-out type wafer level package manufactured according to another embodiment of the present invention.

FIG. 48 is a cross-sectional view of each of a plurality of semiconductor packages isolated from a fan-out type wafer level package manufactured according to another embodiment of the present invention.

Referring to FIG. 48, a semiconductor package 500 according to another embodiment of the present invention may include a bottom semiconductor package 100 and a top semiconductor package 300 stacked thereon.

Bottom Semiconductor Package 100

The bottom semiconductor package 100 is the same as the semiconductor package of FIG. 1. Thus, the descriptions made with reference to FIG. 1 are applied to the bottom semiconductor package 100.

Top Semiconductor Package 300

The top semiconductor package 300 may be stacked on the bottom semiconductor package 100 by using a thermal compression non-conductive paste (TCNCP) bonding process.

The top semiconductor package 300 is a chip-stacked type package and may include a bottom chip 210, which is stacked on the bottom semiconductor package 100, and a top chip 230 which is stacked on the bottom chip 210.

The bottom chip 210 may be electrically connected to the other end of a TSV 117, which passes through the inside of a semiconductor chip 111 included in the bottom semiconductor package 100, by a conductive bump 212 formed thereunder.

The bottom chip 210 may be bonded to the other end of the TSV 117 by the TCNCP bonding process which applies pressure by using a non-conductive paste (NCP) 220 at a certain temperature.

The top chip 220 may be electrically connected to the bottom chip 210 by using a TSV 214 passing through the inside of the bottom chip 210.

A conductive bump 232 of the top chip 220 may be bonded to the TSV 214 of the bottom chip 210 by the TCNCP bonding process using the non-conductive paste 220. Here, a conductive bump 212 of the bottom chip 210 may be a copper (Cu) pillar which is formed to a certain height from a bonding pad of the bottom chip 210 by a copper plating process. The conductive bump 232 of the top chip 230 may be a fine solder ball.

FIGS. 49 to 67 are cross-sectional views illustrating a method of manufacturing a fan-out type wafer level package for manufacturing the semiconductor package of FIG. 48, according to another embodiment of the present invention.

In each of the cross-sectional views, only one wafer chip is illustrated. This is for helping understand the present invention. It should be noted that each of the following processes is simultaneously performed for a plurality of wafer chips isolated from a wafer in an actual process.

In describing the method of manufacturing the fan-out type wafer level package according to another embodiment of the present invention, details repetitive of the above-described details of FIGS. 1 to 12 will be briefly described.

Figure 49:
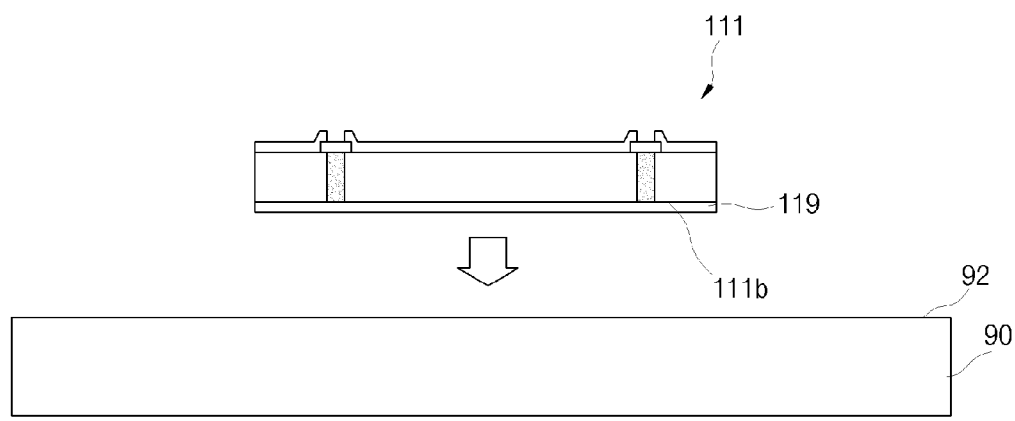
FIGS. 49 to 67 are cross-sectional views illustrating a method of manufacturing a fan-out type wafer level package for manufacturing the semiconductor package of FIG. 48, according to another embodiment of the present invention.

Referring to FIG. 49, a process of attaching a plurality of semiconductor chips 111, isolated from a wafer level package, to a supporting frame 90 may be performed. A DAF 119 may be coated on a second surface 111b of each of the plurality of semiconductor chips 111, and the semiconductor chips 111 may be attached to a surface 92 of the supporting frame 90 by the DAF 119. The supporting frame 90 may use a silicon wafer or a glass wafer.

Figure 50:
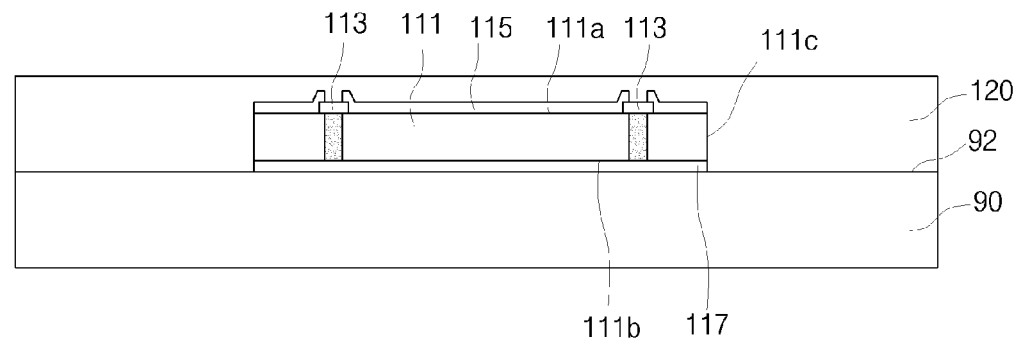

Subsequently, referring to FIG. 50, a process of forming a first repassivation layer 120 that encapsulates a surface 92 of the supporting frame 90, an input/output pad 113 formed on a second surface 111a of the semiconductor chip 111, a passivation layer 115, and a side surface 111c of the semiconductor chip 111 may be performed. A method of forming the first repassivation layer 120 may use the coating process or the CVD process. The first repassivation layer 120 may be formed of polyimide (PI), benzo cyclo butene (BCB), poly benz oxazole (PBO), bismaleimidetriazine (BT), phenolic resin, epoxy, silicon, silicon oxide ($SiO_2$), silicon nitride ($Si_3N_4$), or a combination thereof.

Figure 51:
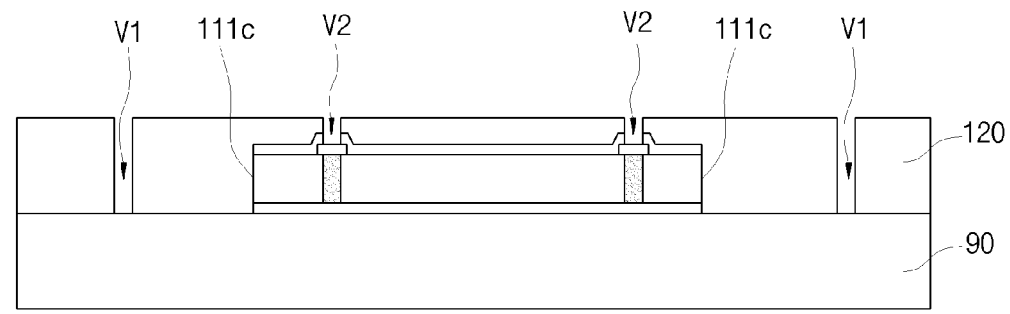

Subsequently, referring to FIG. 51, a process of forming a plurality of interposer via holes V1 and V2 passing through the inside of the first repassivation layer 120 may be performed. The interposer via holes V1 and V2 may be formed by using the photomask process including the exposure process and the development process.

Figure 52:
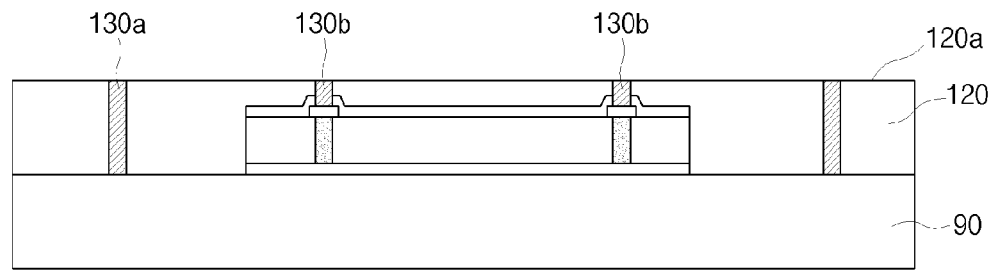

Subsequently, referring to FIG. 52, a process of forming a TEV 130 (130a and 130b) by filling a conductive material into the interposer via holes V1 and V2 may be performed. The conductive material may be metal or a metal post. A method of forming the metal or the metal post in the interposer via holes V1 and V2 may use the electroplating process or the electroless plating process.

Figure 53:
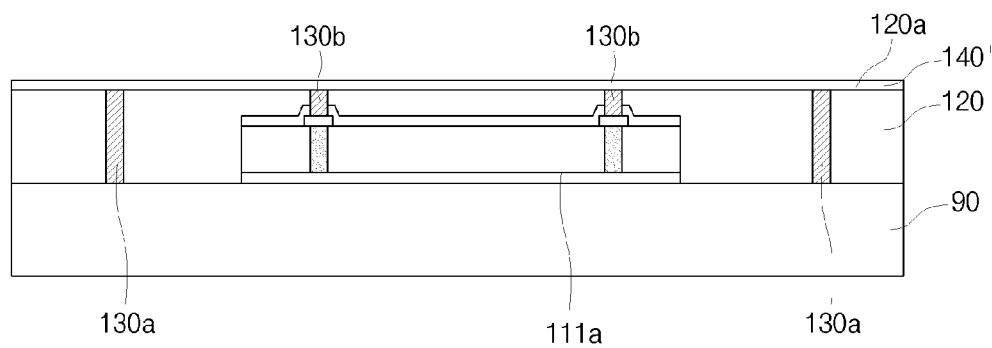

Subsequently, referring to FIG. 53, a metal seed layer 140' may be formed all over a first surface 120a of the first repassivation layer 120. Therefore, the metal seed layer 140' may be electrically connected to one end of the TEV 130 (130a and 130b) exposed to on the first repassivation layer 120.

Figure 54:
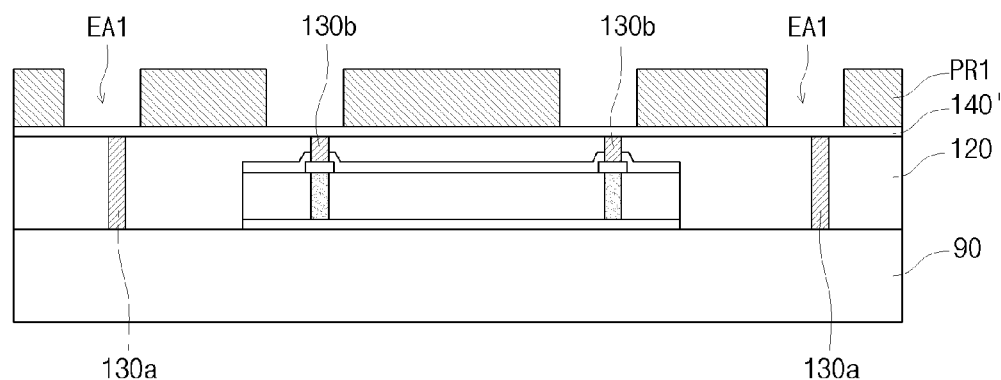

Subsequently, referring to FIG. 54, a first photoresist layer PR1 may be formed all over the metal seed layer 140', and an exposure area EA1 of the first photoresist layer PR1 may be removed by the exposure process and the development process.

Figure 55:
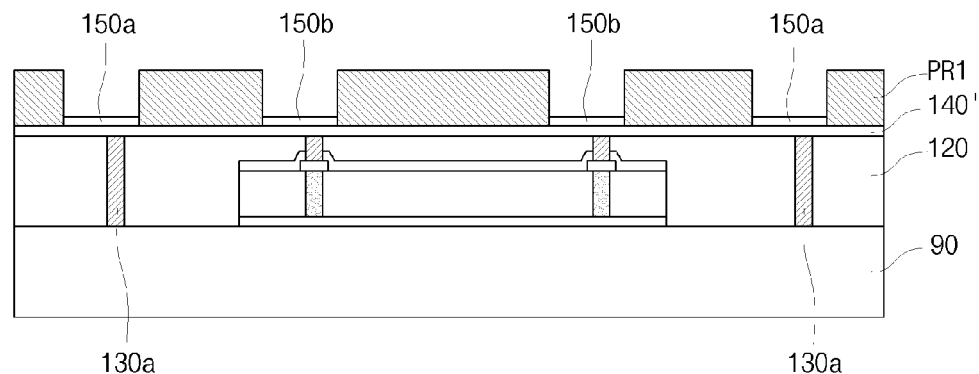

Subsequently, referring to FIG. 55, a process of forming an RDL 150 (150a and 150b) on the metal seed layer 140' which is exposed by removing the exposure area EA1 of the first photoresist layer PR1 may be performed. A method of forming the RDL 150 (150a and 150b) may use the electroplating process or the electroless plating process. In the present embodiment, the electroplating process is assumed as being used.

Figure 56:
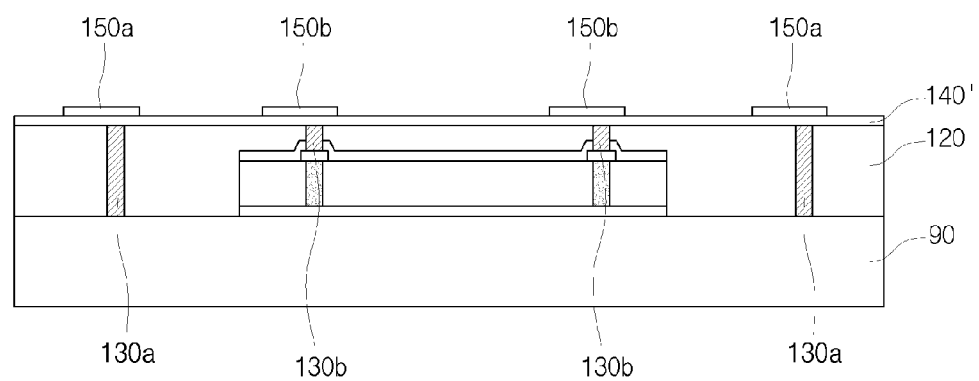

Subsequently, referring to FIG. 56, a process of removing the first photoresist layer PR1 formed on the metal seed layer 140' may be performed. A method of removing the first photoresist layer PR1 may use the dry etching process or the wet etching process.

Figure 57:
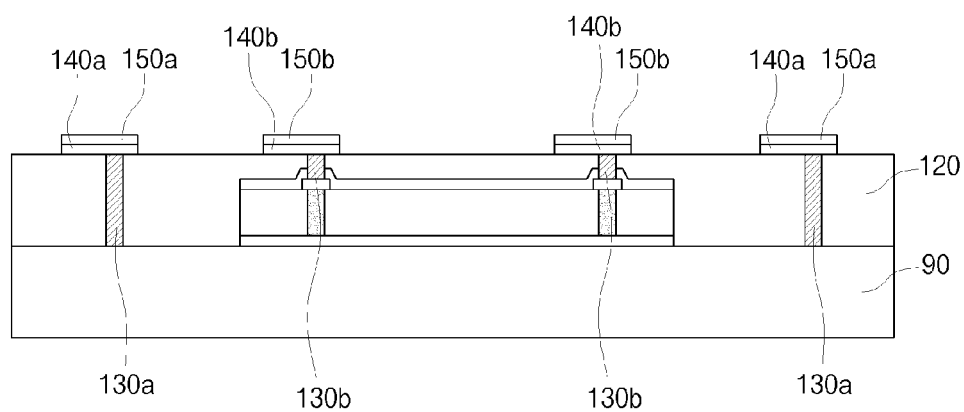

Subsequently, referring to FIG. 57, a process of removing the metal seed layer 140' which is exposed by removing the first photoresist layer PR1 may be performed. In this case, the first repassivation layer 120 may be exposed by removing the metal seed layer 140'. A method of removing the metal seed layer 140' may use the wet etching process or the dry etching process.

Hereinafter, the metal seed layer 140' which is left on the RDL 150 (150*a* and 150*b*) may be referred to as a redistribution seed layer, which is referred to by reference numeral 140.

Figure 58:
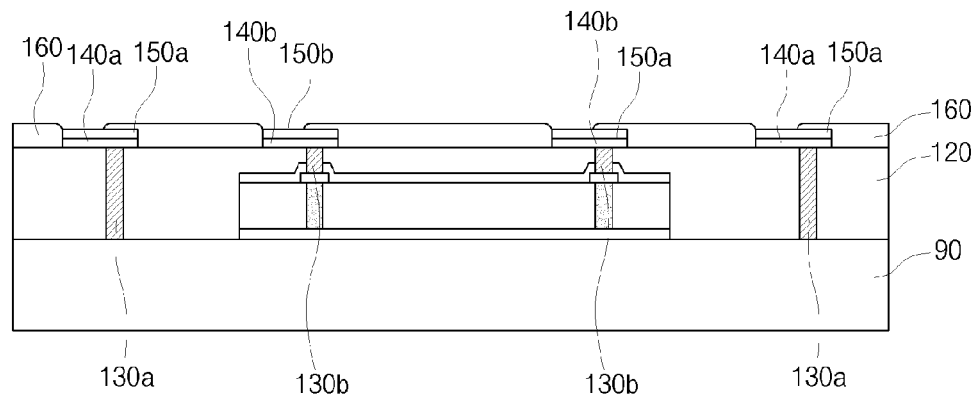

Subsequently, referring to FIG. 58, a process of forming a second repassivation layer 160 on the RDL 150 (150*a* and 150*b*) and the first repassivation layer 120 which is exposed by removing the metal seed layer 140' may be performed. In this case, the second repassivation layer 160 may be formed to expose a partial region of the RDL 150 (150*a* and 150*b*). A method of forming the second repassivation layer 160 may use the photomask process including the exposure process and the development process.

Figure 59:
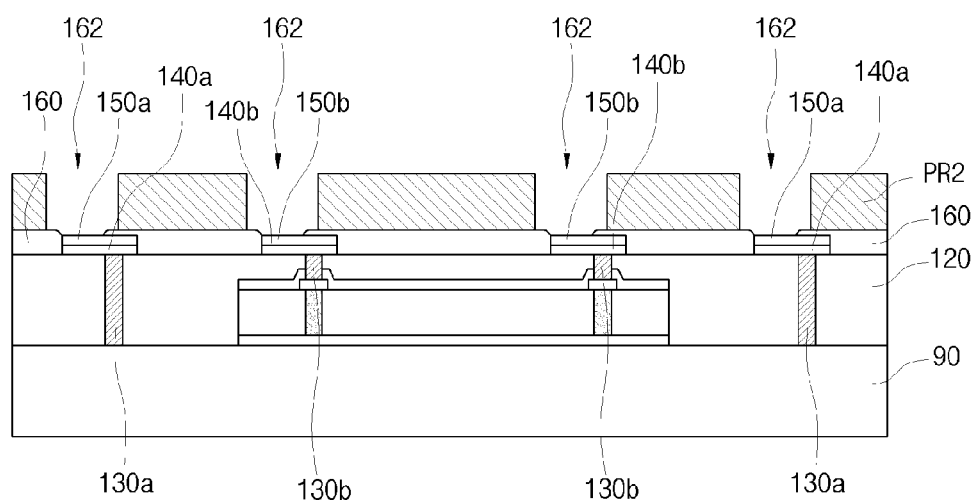

Subsequently, referring to FIG. 59, a process of forming a second photoresist layer PR2 on the second repassivation layer 160 may be performed. The second photoresist layer PR2 may include a contact hole 162 that exposes a partial region of the exposed RDL 150 (150*a* and 150*b*). A method of forming the second photoresist layer PR2 including the contact hole 162 may use the photomask process including the exposure process and the development process.

Figure 60:
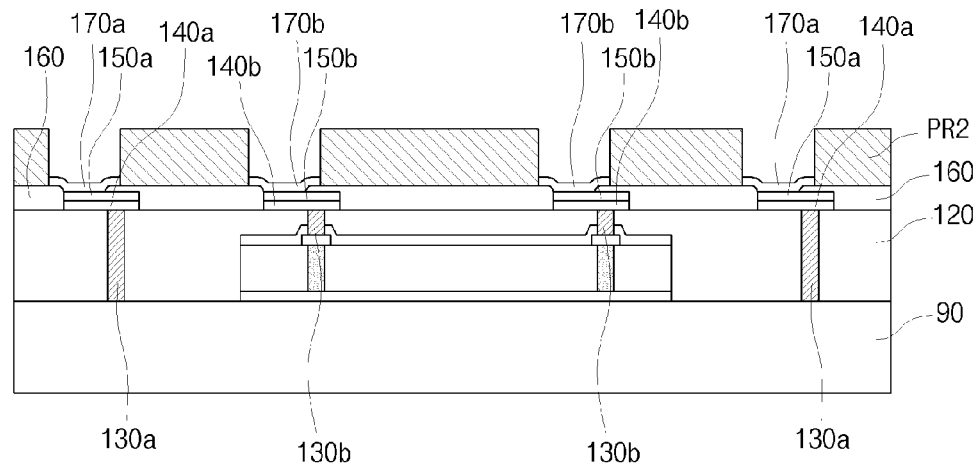

Subsequently, referring to FIG. 60, a process of forming a UBM layer 170 (170*a* and 170*b*) in the contact hole 162 may be formed. A method of forming the UBM layer 170 (170*a* and 170*b*) may use the electroplating process or the electroless plating process.

Figure 61:
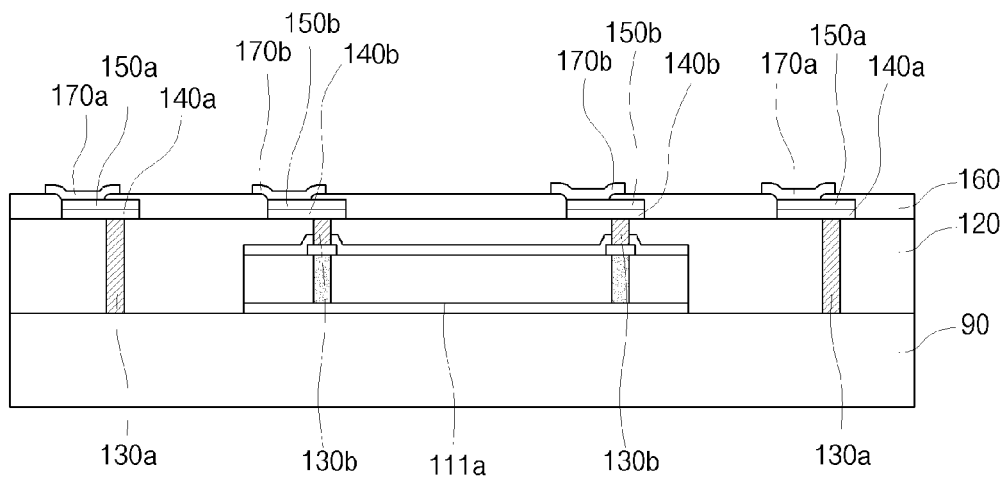

Subsequently, referring to FIG. 61, a process of forming the second photoresist layer PR2 including the contact hole 162 may be performed. A method of removing the second photoresist layer PR2 may use the dry etching process or the wet etching process.

Figure 62:
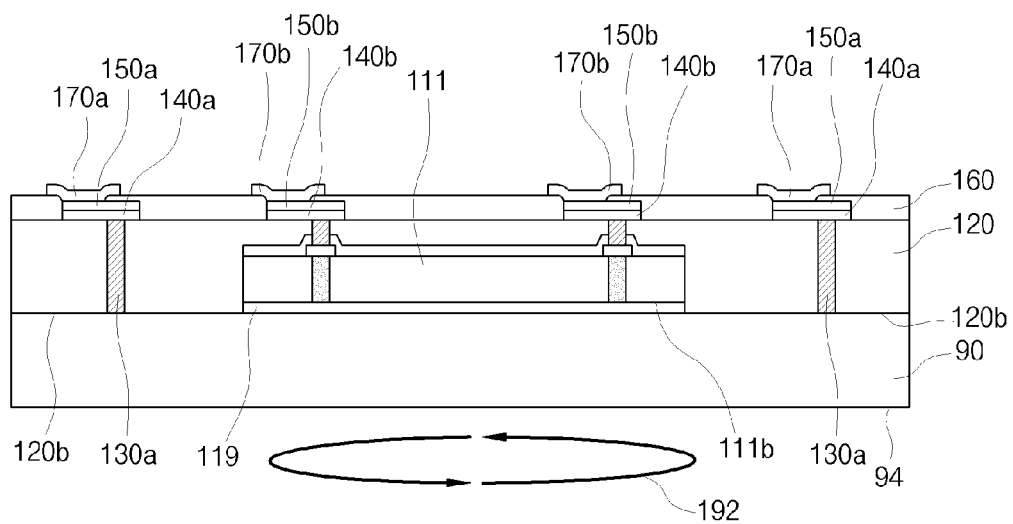

Subsequently, referring to FIG. 62, a process of sequentially removing the supporting frame 90 and the DAF 119 attached to the second surface 111*b* of the semiconductor chip 111 may be performed. A method of removing the supporting frame 90 may use the back grinding 192 process, and the DAF 119 may be removed by the UV process or the heating process.

Figure 63:
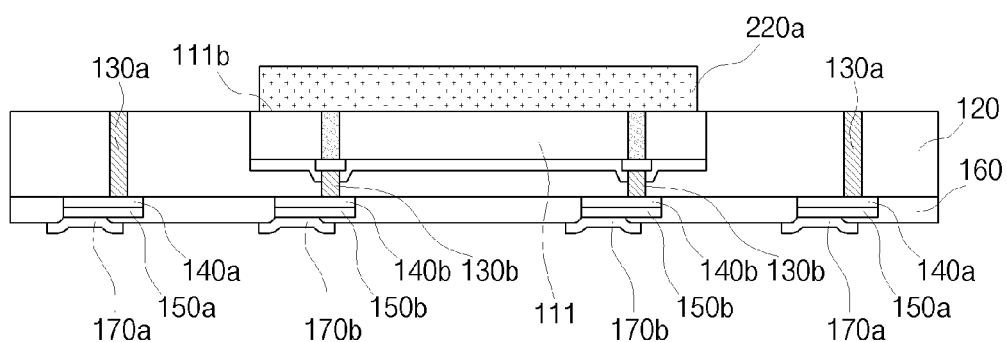

Subsequently, referring to FIG. 63, a non-conductive paste 220*a* that is a type of adhesive may be coated on the second surface 111*b* of the semiconductor chip 111 which is exposed by removing the DAF 119.

Figure 64:
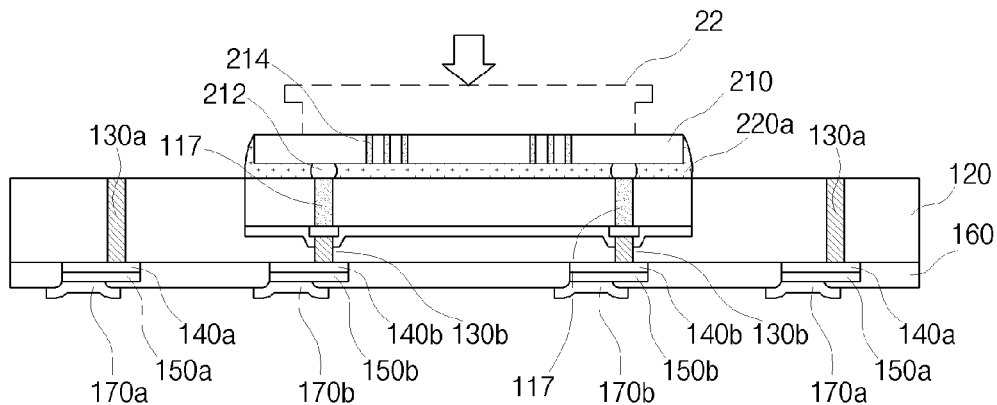

Subsequently, referring to FIG. 64, a bottom chip 210 where a bonding tool 22 is sawed in a wafer state may be picked up and may be transferred to on the second surface 111*b* of the semiconductor chip 111, and then, a process of lowering the bottom chip 210 toward the non-conductive paste 220*a* (hereinafter referred to as a first non-conductive paste) coated on the second surface 111*b* of the semiconductor chip 111. In such an operation, the conductive bump 212 of the bottom chip 210 may perforate the first non-conductive paste 220*a* which is in a before-hardening state, and may be disposed at the other end of the TSV 117 exposed to on the second surface 111*b*. Here, although not shown in the drawing, a bonding pad (not shown) electrically connected to the other end of the TSV 117 may be formed on the second surface 111*b* of the semiconductor chip 111. In this case, the conductive bump 212 of the bottom chip 210 may be disposed at the bonding pad of the semiconductor chip 111.

When the conductive bump 212 of the bottom chip 210 is disposed at the other end of the TSV 117 or the bonding pad (not shown) electrically connected to the other end of the TSV 117, the bonding tool 22 may pressurize the bottom chip 210 with certain force under a heat-applied condition, and thus, the conductive bump 212 of the bottom chip 210 may be bonded to the other end of the TSV 117 or the bonding pad electrically connected to the other end of the TSV 117. In this case, the conductive bump 212 of the bottom chip 210 may be insulated from the first non-conductive paste 220*a*.

Figure 65:
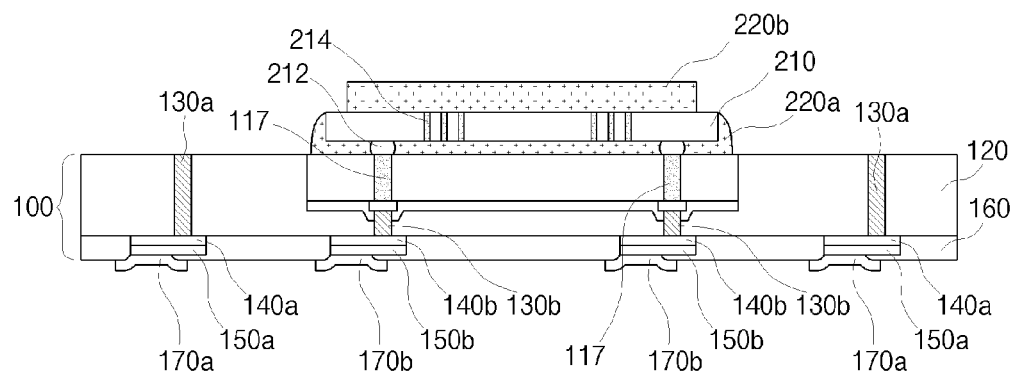

Subsequently, referring to FIG. 65, the first non-conductive paste 220*a* may be hardened, and then, a process of coating a second non-conductive paste 220*b* on a top of the bottom chip 210 may be again performed.

Figure 66:
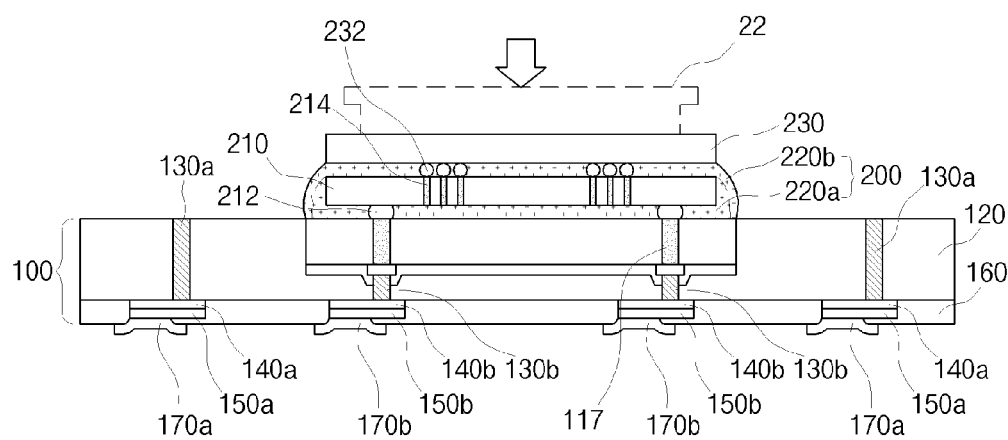

Subsequently, referring to FIG. 66, the bonding tool 22 may pick up the bottom chip 230 and transfer the bottom chip 230 to on the bottom chip 210, and then, under a heat-applied condition, the conductive bump 232 of the top chip 230 picked up by the bonding tool 22 may perforate the second conductive paste 220*b* and may be disposed on an upper end of a TSV 214 of the bottom chip 210. Subsequently, in a state where the conductive bump 232 of the top chip 230 is disposed at the upper end of the TSV 214 of the bottom chip 210, the bonding tool 22 may pressurize the top chip 230 with certain force under a condition where certain heat is applied thereto, and thus, the conductive bump 232 of the top chip 230 may be bonded to the upper end of the TSV 214 of the bottom chip 210.

Therefore, the top chip 230 may be stacked on the bottom chip 210, and the conductive bump 232 of the top chip 230 may be insulated from the second non-conductive paste 220*b*.

Figure 67:
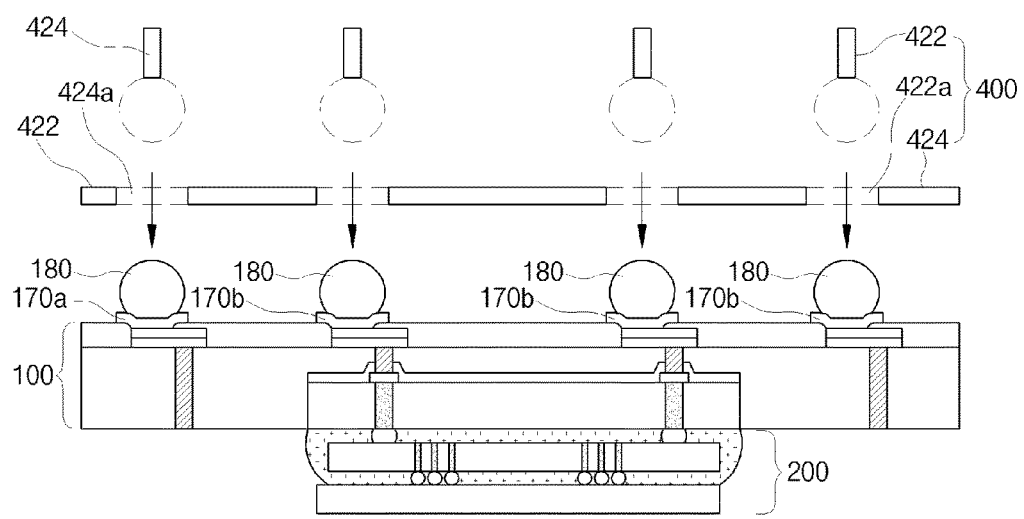

Subsequently, referring to FIG. 67, a process of forming a ball-shaped conductive bump 180 on the UBM layer 170 (170*a* and 170*b*) may be performed. A method of forming the bump ball 180 may use a ball drop process using a ball attach apparatus 400.

In detail, the ball attach apparatus 400 for forming the conductive bump 180 on the UBM layer 170 (170*a* and 170*b*) may include an eject pin 422, which transfers the conductive bump 180, and an attach plate 424 including a plurality of holes 424*a* which each have a broader width than that of the bump ball 180.

First, a wafer level package 100 where the UBM layer 170 (170*a* and 170*b*) is formed may be disposed under the attach plate 424, and then, the attach plate 424 may be adjusted in order the plurality of holes 424*a* to be disposed on the UBM layer 170 (170*a* and 170*b*).

Subsequently, the eject pin 424 may pick up the conductive bump 180 and transfer the conductive bump 180 to on the holes 424*a*, and then, the eject pin 424 may release the pickup of the bump ball 180 and drop the UBM layer 170 (170*a* and 170*b*), aligned under a corresponding hole 424*a*, onto the UBM layer 170 (170*a* and 170*b*) to attach the conductive bump 180.

When the bump ball 180 is attached to the UBM layer 170 (170*a* and 170*b*), a wafer level package may be singularized into a plurality of semiconductor packages along a dicing line, and thus, the semiconductor package 500 illustrated in FIG. 48 may be manufactured.

Hereinabove, in the method of manufacturing the wafer level package according to an embodiment of the present invention, a series of all processes of manufacturing a wafer level package are performed on a supporting frame such as a silicon wafer or a glass wafer.

Therefore, a warpage defect is prevented from occurring when a process of manufacturing a molding material-based wafer level package is being performed.

Moreover, since the warpage defects are reduced, mask accuracy is enhanced in the photomask process.

Moreover, since the molding process is skipped, a total process time is shortened, and since a mold frame (or a carrier) is not used, a manufacturing process is efficiently managed.

Since a TSV is formed in a repassivation layer that encapsulates a wafer chip, the present invention may be applied to various package structures which enable other packages and elements to be stacked.

According to the embodiments of the present invention, a series of all processes of manufacturing a wafer level package are performed on a supporting frame such as a silicon wafer or a glass wafer, thereby reducing warpage defects that occur when a related art process of manufacturing a molding material-based wafer level package in a state of being isolated from a molding frame is being performed.

Moreover, according to the embodiments of the present invention, since the warpage defects are reduced, mask accuracy is enhanced in the photomask process.

Moreover, according to the embodiments of the present invention, a molding process is omitted, and thus, a total process time is shortened.

Moreover, according to the embodiments of the present invention, unlike the related art where a plurality of wafer chips are reconstituted into a molding material-based wafer level package, a plurality of wafer chips are reconstituted with a repassivation material, and the TEV is formed in the repassivation material. Accordingly, the present invention may be applied to various package structures which enable other packages and elements to be stacked.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a wafer level package, the method comprising:
   (A) forming a first repassivation layer that encapsulates a plurality of semiconductor chips isolated from a wafer;
   (B) forming a through encapsulation via (TEV) in the first repassivation layer;
   (C) forming a redistribution layer, electrically connected to the TEV, on the first repassivation layer; and
   (D) forming a conductive bump on the redistribution layer;
   wherein step (C) comprises:
      forming a metal seed layer, electrically connected to one end of the TEV exposed to on the first repassivation layer, all over the first repassivation layer by using a physical vapor deposition process or a chemical vapor deposition process;
      forming a photoresist layer on the metal seed layer and removing an exposure area of the photoresist layer by using an exposure process and a development process;
      forming the redistribution layer on the metal seed layer, which is exposed by removing the exposure area, by using a plating process;
      removing the photoresist layer; and
      removing the metal seed layer, which is exposed by removing the photoresist layer, by using the redistribution layer as an etching mask.

2. The method of claim 1, further comprising, before step (A), attaching the plurality of semiconductor chips to a supporting frame which includes a silicon wafer or a glass wafer.

3. The method of claim 2, further comprising, after step (D), removing the supporting frame by using a back grinding process.

4. The method of claim 1, wherein step (B) comprises:
   forming a hole, which vertically passes through an inside of the first repassivation layer, by using a laser drilling process; and
   filling a conductive material into the hole to form the TEV by using a plating process.

5. The method of claim 1, wherein the first repassivation layer formed in step (A) is formed of polyimide (PI), benzo cyclo butene (BCB), poly benz oxazole (PBO), bismaleimidetriazine (BT), phenolic resin, epoxy, silicon, silicon oxide (SiO2), silicon nitride (Si3N4), or a combination thereof.

6. The method of claim 1, wherein step (D) comprises:
   forming a second repassivation layer which exposes a partial region of the redistribution layer;
   forming a photoresist layer, including an exposure area corresponding to the partial region, on the second repassivation layer;
   removing the exposure area to form a contact hole in the photoresist layer by using an exposure process and a development process;
   sequentially forming an under bump metal layer and a bump material in the contact hole by using a plating process;
   removing the photoresist layer; and
   forming the conductive bump from the bump material by using a reflow process.

7. A method of manufacturing a wafer level package, the method comprising:
   (A) forming a repassivation layer that encapsulates a plurality of semiconductor chips isolated from a wafer;
   (B) forming a through encapsulation via (TEV) in the repassivation layer;
   (C) forming, on a first surface of the repassivation layer, a bottom redistribution layer electrically connected to one end of the TEV exposed to on the first surface;
   (D) forming a bottom bump on the bottom redistribution layer to finish a wafer level package including a bottom layer structure;
   (E) forming, on a second surface on the reverse of the first surface of the repassivation layer, a top redistribution layer electrically connected to the other end of the TEV exposed to on the second surface; and
   (F) forming a top bump on the top redistribution layer to finish a wafer level package including a top layer structure;
   wherein step (C) comprises:
      forming, on a first surface of the repassivation layer, a bottom metal seed layer electrically connected to one end of the TEV exposed to on the first surface;
      forming a photoresist layer on the bottom metal seed layer and removing an exposure area of the photoresist layer by using an exposure process and a development process;

forming the bottom redistribution layer on the bottom metal seed layer which is exposed by removing the exposure area; and removing the photoresist layer and removing, by using an etching process, the bottom metal seed layer which is exposed by removing the photoresist layer.

8. The method of claim 7, further comprising, before step (A), attaching the plurality of semiconductor chips to a first supporting frame which includes a silicon wafer or a glass wafer.

9. The method of claim 8, further comprising, between step (D) and step (E), attaching, by using a die attach film, the wafer level package including the bottom layer structure to a second supporting frame which includes a silicon wafer or a glass wafer; and removing the first supporting frame by using a back grinding process.

10. The method of claim 9, further comprising, after step (F), removing the second supporting frame by using a back grinding process.

11. The method of claim 8, wherein step (D) comprises:

forming a top repassivation layer, which exposes a partial region of the top redistribution layer, on a second surface of the repassivation layer;

forming a photoresist layer, including a contact hole corresponding to the partial region, on the top repassivation layer;

sequentially forming a top under bump metal layer and a top bump material in the contact hole by using a plating process;

removing the photoresist layer; and forming the top bump from the top bump material by using a reflow process.

12. The method of claim 7, wherein the repassivation layer formed in step (A) is formed of polyimide (PI), benzo cyclo butene (BCB), poly benz oxazole (PBO), bismaleimidetriazine (BT), phenolic resin, epoxy, silicon, silicon oxide (SiO2), silicon nitride (Si3N4), or a combination thereof.

13. The method of claim 7, wherein step (B) comprises:

forming a hole, which vertically passes through an inside of the repassivation layer, by using a laser drilling process; and filling a conductive material into the hole to form the TEV by using a plating process.

14. The method of claim 7, wherein step (E) comprises:

forming, on a second surface of the repassivation layer, a top metal seed layer electrically connected to the other end of the TEV exposed to on the second surface;

forming a photoresist layer on the top metal seed layer and removing an exposure area of the photoresist layer by using an exposure process and a development process;

forming the top redistribution layer on the top metal seed layer which is exposed by removing the exposure area; and removing the photoresist layer and removing, by using an etching process, the top metal seed layer which is exposed by removing the photoresist layer.

15. The method of claim 7, wherein step (D) comprises:

forming a bottom repassivation layer, which exposes a partial region of the bottom redistribution layer, on a first surface of the repassivation layer;

forming a photoresist layer, including a contact hole corresponding to the partial region, on the bottom repassivation layer;

sequentially forming a bottom under bump metal layer and a bottom bump material in the contact hole by using a plating process;

removing the photoresist layer; and forming the bottom bump from the bottom bump material by using a reflow process.

16. A method of manufacturing a wafer level package, the method comprising:

(A) forming a first repassivation layer that encapsulates a plurality of semiconductor chips isolated from a wafer;

(B) forming a through encapsulation via (TEV) in the first repassivation layer;

(C) forming a redistribution layer, electrically connected to the TEV, on the first repassivation layer;

(D) forming an under bump metal layer on the redistribution layer;

(E) forming chip-stacked type packages on the plurality of semiconductor chips by using a thermal compression non-conductive paste bonding process; and (F) forming a bump ball on the under bump metal layer by using a ball drop process.

17. The method of claim 16, further comprising, before step (A), attaching the plurality of semiconductor chips to a supporting frame which includes a silicon wafer or a glass wafer.

18. The method of claim 17, further comprising, between step (D) and step (E), removing the supporting frame by using a back grinding process.

19. The method of claim 17, wherein step (B) comprises:

forming a hole, which vertically passes through an inside of the first repassivation layer, by using a laser drilling process; and filling a conductive material into the hole to form the TEV by using a plating process.

* * * * *